United States Patent
Takahama

(10) Patent No.: US 10,367,105 B2
(45) Date of Patent: Jul. 30, 2019

(54) SOLAR CELL, SOLAR CELL MODULE, AND MANUFACTURING METHOD FOR SOLAR CELL

(71) Applicant: Panasonic Intellectual Property Management Co., Ltd., Osaka (JP)

(72) Inventor: Tsuyoshi Takahama, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 48 days.

(21) Appl. No.: 15/064,172

(22) Filed: Mar. 8, 2016

(65) Prior Publication Data

US 2016/0240705 A1    Aug. 18, 2016

Related U.S. Application Data

(63) Continuation of application No. PCT/JP2014/003953, filed on Jul. 28, 2014.

(30) Foreign Application Priority Data

Sep. 25, 2013  (JP) .................................. 2013-198797
Sep. 25, 2013  (JP) .................................. 2013-198798

(51) Int. Cl.
*H01L 31/044*    (2014.01)
*H01L 31/0224*   (2006.01)
(Continued)

(52) U.S. Cl.
CPC ........... *H01L 31/022441* (2013.01); *H01L 31/03529* (2013.01); *H01L 31/0516* (2013.01); *H01L 31/0747* (2013.01); *Y02E 10/50* (2013.01)

(58) Field of Classification Search
CPC ........ H01L 31/00–31/078; Y02E 10/50–10/60
(Continued)

(56) References Cited

U.S. PATENT DOCUMENTS 4,062,698 A     12/1977   Blakeslee et al.
5,164,019 A  *  11/1992   Sinton ................. H01L 31/0475
                                                    136/249
(Continued)

FOREIGN PATENT DOCUMENTS

DE   10 2008 021 355 A1   10/2009
DE   10 2008 033 189 A1   11/2009
(Continued)

OTHER PUBLICATIONS

International Search Report dated Sep. 2, 2014, issued in corresponding PCT/JP2014/003953. (w/ partial English translation).
(Continued)

*Primary Examiner* — Bach T Dinh
(74) *Attorney, Agent, or Firm* — McDermott Will & Emery LLP

(57) ABSTRACT

A solar cell includes a photoelectric converter having n-type regions and p-type regions alternately arranged in a first direction on a back surface and an electrode layer provided on the back surface. The photoelectric converter includes a plurality of sub-cells arranged in a second direction intersecting with the first direction and an isolation region provided on a boundary between adjacent sub-cells. The electrode layer includes an n-side electrode provided on the n-type region in the sub-cell at the end of the sub-cells, a p-side electrode provided on the p-type region in the sub-cell at the other end, and a sub-electrode provided over two adjacent sub-cells. The sub-electrode connects the n-type region provided in one sub-cell of the two adjacent sub-cells to the p-type region provided in the other sub-cell.

19 Claims, 43 Drawing Sheets

(51) Int. Cl.
  *H01L 31/0747* (2012.01)
  *H01L 31/0352* (2006.01)
  *H01L 31/05* (2014.01)

(58) Field of Classification Search
  USPC .................................................. 136/243–265
  See application file for complete search history.

(56) References Cited

U.S. PATENT DOCUMENTS

| | | | |
|---|---|---|---|
| 5,328,519 | A | 7/1994 | Kawakami |
| 5,620,528 | A | 4/1997 | Schade et al. |
| 6,441,297 | B1 | 8/2002 | Keller et al. |
| 2005/0268959 | A1* | 12/2005 | Aschenbrenner ... H01L 31/0508 136/244 |
| 2007/0256728 | A1* | 11/2007 | Cousins ............. H01L 31/0745 136/252 |
| 2009/0260672 | A1 | 10/2009 | Taira |
| 2010/0243028 | A1* | 9/2010 | Sainoo ............. H01L 31/02245 136/244 |
| 2011/0000532 | A1* | 1/2011 | Niira ............... H01L 31/0747 136/255 |
| 2012/0138128 | A1* | 6/2012 | Wu ................. H01L 31/02245 136/255 |
| 2012/0318326 | A1* | 12/2012 | Nishikawa .......... H01L 31/0463 136/246 |
| 2013/0137211 | A1 | 5/2013 | Mishima |
| 2013/0298963 | A1* | 11/2013 | Greiff ................. H01L 31/068 136/246 |

FOREIGN PATENT DOCUMENTS

| | | |
|---|---|---|
| DE | 10 2008 043 833 A1 | 5/2010 |
| DE | 10 2011 078 371 A1 | 1/2013 |
| DE | 10 2012 220 221 A1 | 5/2014 |
| JP | 2004-031839 A | 1/2004 |
| JP | 2012-028718 A | 2/2012 |
| JP | 2012-049193 A | 3/2012 |
| JP | 2012-195453 A | 10/2012 |

OTHER PUBLICATIONS

Office Action issued in related U.S. Appl. No. 14/864,443, dated Mar. 9, 2017.
Office Action issued in related U.S. Appl. No. 14/864,443, dated Oct. 19, 2017.
Non-Final Office Action issued in related U.S. Appl. No. 14/864,443, dated May 10, 2018.
John van Roosmalen, et al., "Crystalline Silicon Interconnected Strips (XIS): Introduction to a New, Integrated Device and Module Concept," IEEE, pp. 001129-001134, 2011.

\* cited by examiner

SOLAR CELL, SOLAR CELL MODULE, AND MANUFACTURING METHOD FOR SOLAR CELL

RELATED APPLICATION

This Application is a Continuation of PCT/JP2014/003953, filed on Jul. 28, 2014, which in turn claims priority to Japanese Patent Application No. 2013-198797, filed on Sep. 25, 2013 and Japanese Patent Application No. 2013-198798, filed on Sep. 25, 2013, the entire contents of which are incorporated herein by reference.

BACKGROUND

1. Field of the Invention

The present invention relates to a solar cell, and especially, to a back-contact type solar cell.

2. Description of the Related Art

As a solar cell with high power generation efficiency, there is a back-contact type solar cell having a back surface opposed to a light receiving surface in which light enters. An n-type region and a p-type region are formed on the back surface. In the back-contact type solar cell, both the n-side electrode and the p-side electrode to takeout generated power are provided on a side of the back surface. Each of the n-side electrode and the p-side electrode is formed in a comb shape.

SUMMARY

It is desirable that the back-contact type solar cell have an electrode structure with high current collecting efficiency.

The present invention has been made in consideration of this situation. A purpose of the present invention is to provide a solar cell and a solar cell module with improved power generation efficiency.

To solve the above problem, a solar cell according to one aspect of the present invention includes a photoelectric converter which includes a light receiving surface and a back surface opposed to the light receiving surface and in which n-type regions and p-type regions are alternately arranged in a first direction on the back surface and an electrode layer provided on the back surface. The photoelectric converter includes a plurality of sub-cells arranged in a second direction intersecting with the first direction and an isolation region provided on a boundary between adjacent sub-cells. The electrode layer includes an n-side electrode which is provided on the n-type region in the sub-cell at an end of the plurality of sub-cells, a p-side electrode which is provided on the p-type region in the sub-cell at the other end, and a sub-electrode which is provided over the two adjacent sub-cells. The sub-electrode connects the n-type region provided in one sub-cell of the two adjacent sub-cells and the p-type region provided in the other sub-cell.

Another aspect of the present invention is a manufacturing method for a solar cell. In this method, the photoelectric converter is prepared which includes the light receiving surface and the back surface opposed to the light receiving surface and in which the n-type regions and the p-type regions are alternately arranged in the first direction on the back surface. After the electrode layer has been formed on the n-type region and the p-type region, the groove extended in the first direction is formed on the light receiving surface, and the photoelectric converter is divided into the plurality of sub-cells along the groove.

A still another aspect of the present invention is a solar cell module. The solar cell module includes a plurality of solar cells and a wiring material for connecting the solar cells to each other. The solar cell includes a photoelectric converter which includes a light receiving surface and a back surface opposed to the light receiving surface and in which n-type regions and p-type regions are alternately arranged in a first direction on the back surface and an electrode layer provided on the n-type region and the p-type region. The photoelectric converter includes a plurality of sub-cells arranged in a second direction intersecting with the first direction and an isolation region provided on a boundary between adjacent sub-cells. The electrode layer includes an n-side electrode which is provided in the sub-cell at an end of the plurality of sub-cells, the p-side electrode which is provided in the sub-cell at the other end, and a sub-electrode which is provided over the two adjacent sub-cells. The sub-electrode connects the n-type region provided in one sub-cell of the two adjacent sub-cells to the p-type region provided in the other sub-cell. The wiring material connects the n-side electrode of one solar cell of adjacent solar cells to the p-side electrode of the other solar cell.

BRIEF DESCRIPTION OF THE DRAWINGS

Embodiments will now be described, byway of example only, with reference to the accompanying drawings which are meant to be exemplary, not limiting, and wherein like elements are numbered alike in several Figures, in which.

DETAILED DESCRIPTION

Figure 1:
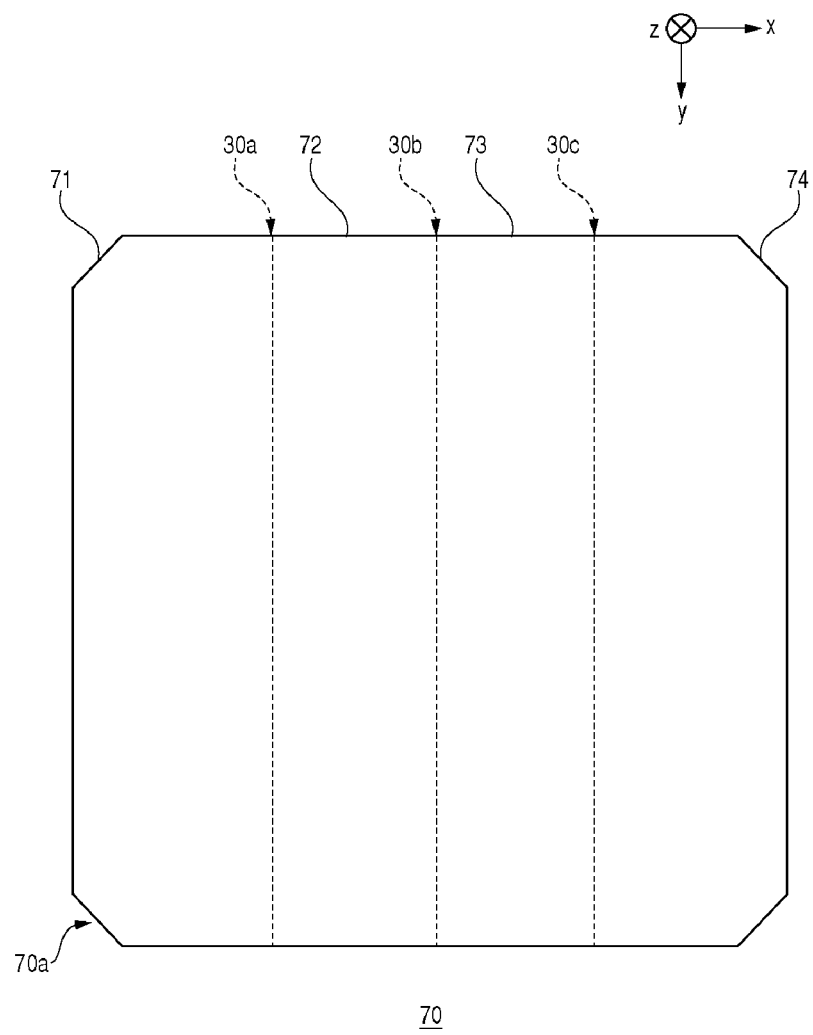
FIG. 1 is a plan view of a solar cell according to a first embodiment.

The invention will now be described by reference to the preferred embodiments. This does not intend to limit the scope of the present invention, but to exemplify the invention.

Embodiments of the present invention will be described in detail below with reference to the drawings. In the description on the drawings, the same element is denoted with the same reference numeral, and overlapped description will be appropriately omitted.

Before specifically describing the present invention, the outline will be stated. An embodiment of the present invention is a back-contact type solar cell and a solar cell module for using the same. Electrodes to take out power generated by the solar cell are provided on a back surface of the solar cell opposed to a light receiving surface where light mainly enters. In the back-contact type solar cell, for example, n-type regions and p-type regions are alternately arranged in a first direction on the side of the back surface. On the respective regions, an n-side electrode or a p-side electrode is provided, and the n-side electrode and the p-side electrode are extended in a second direction intersecting with the first direction.

In the solar cell according to the present embodiment, a photoelectric converter of the solar cell is divided into a plurality of sub-cells, and an isolation region is provided on a boundary between adjacent sub-cells. The two adjacent sub-cells are connected in series by a sub-electrode provided over both the two adjacent sub-cells. In the present embodiment, by dividing a single solar cell into a plurality of sub-cells, the lengths of the n-side electrode and the p-side electrode extended in the second direction can be shortened, and a resistance of a collector electrode is lowered. A current collecting efficiency of the back surface electrode can be increased by lowering the resistance of the electrode. Also, in the present embodiment, the solar cell in which the plurality of sub-cells is connected in series is integrally formed. Therefore, a manufacturing cost can be lower than that in a case where the sub-cells are connected with an electrically conductive material and the like after each sub-cell has been separately formed.

First Embodiment

A structure of a solar cell 70 according to the present embodiment will be described in detail with reference to FIGS. 1 to 4.

Figure 2:
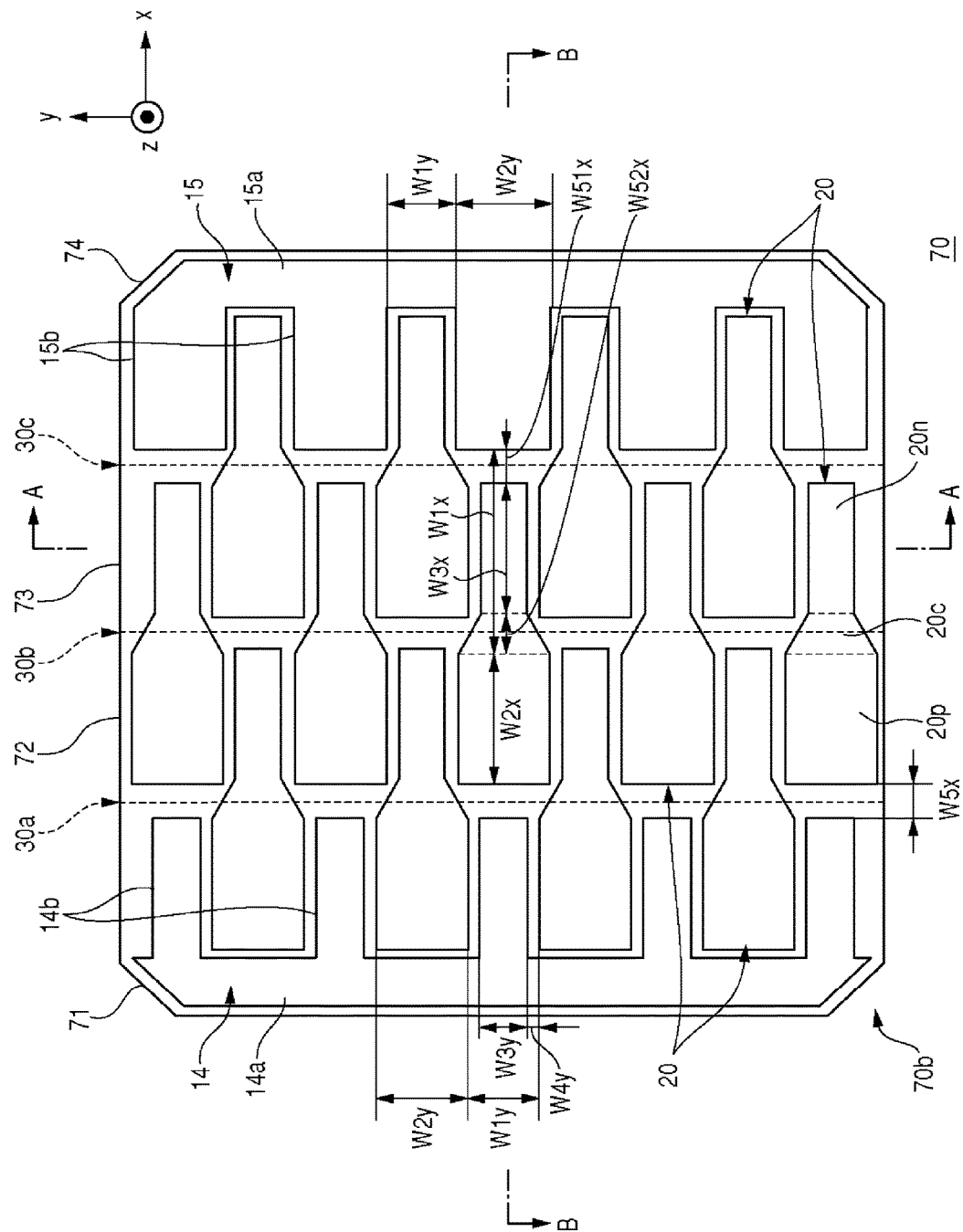
FIG. 2 is a plan view of the solar cell according to the first embodiment.

FIGS. 1 and 2 are plan views of the solar cell 70 according to a first embodiment. FIG. 1 is a diagram of a light receiving surface 70a of the solar cell 70, and FIG. 2 is a diagram of a back surface 70b of the solar cell 70.

As illustrated in FIG. 1, the solar cell 70 includes a plurality of sub-cells 71 to 74. The sub-cells 71 to 74 are divided by boundaries 30a to 30c (collectively referred to as a boundary 30 below) extended in a first direction (y direction) and are provided as being arranged in a second direction (x direction) intersecting with the first direction. The plurality of sub-cells 71 to 74 is arranged along the x direction in this order. The boundary 30 between the sub-cells will be described in detail with reference to FIG. 4.

As illustrated in FIG. 2, the solar cell 70 includes an n-side electrode 14, a p-side electrode 15, and sub-electrodes 20 which are provided on the back surface 70b.

The n-side electrode 14 is formed in a comb shape which includes a bus bar electrode 14a extending in the y direction and a plurality of finger electrodes 14b extending in the x direction. The n-side electrode 14 is provided on the first sub-cell 71. The p-side electrode 15 is formed in a comb shape which includes a bus bar electrode 15a extending in the y direction and a plurality of finger electrodes 15b extending in the x direction. The p-side electrode 15 is provided on the fourth sub-cell 74. Each of the n-side electrode 14 and the p-side electrode 15 may have a structure which has the plurality of fingers and does not have the bus bar electrode.

The sub-electrode 20 includes a p-side part 20p, an n-side part 20n, and a connection part 20c. The sub-electrode 20 is provided over the adjacent sub-cells and connects a p-type region in one sub-cell of the adjacent sub-cells to an n-type region in the other sub-cell. For example, the sub-electrode 20 which connects the second sub-cell 72 to the third sub-cell 73 includes the p-side part 20p provided on the p-type region of the second sub-cell 72, the n-side part 20n provided on the n-type region of the third sub-cell 73, and the connection part 20c which connects both of them. In this case, the connection part 20c is arranged over the boundary 30b between the second sub-cell 72 and the third sub-cell 73.

The p-side electrode 15 and the p-side part 20p are respectively provided in second regions W2x and W2y corresponding to the p-type region. On the other hand, the n-side electrode 14 and the n-side part 20n are respectively provided in third regions W3x and W3y which are provided inside of first regions W1x and W1y corresponding to the n-type region. A fourth region W4y which isolates the n-type region from the p-type region in the y direction is provided between the second region W2y and the third region W3y. In the fourth region W4y, isolation grooves for isolating the sub-electrode 20 from the n-side electrode 14, the p-side electrode 15, or the other sub-electrode 20 are provided. The isolation groove will be described in detail below with reference to FIG. 3.

Also, an isolation region W5x is provided between the adjacent sub-cells, and the boundaries 30a to 30c between the sub-cells are positioned in the isolation regions W5x. As the isolation region, a first isolation region W51x in which the connection part 20c is not provided and a second isolation region W52x in which the connection part 20c is provided are provided. The isolation region will be described in detail below with reference to FIG. 4.

Figure 3:
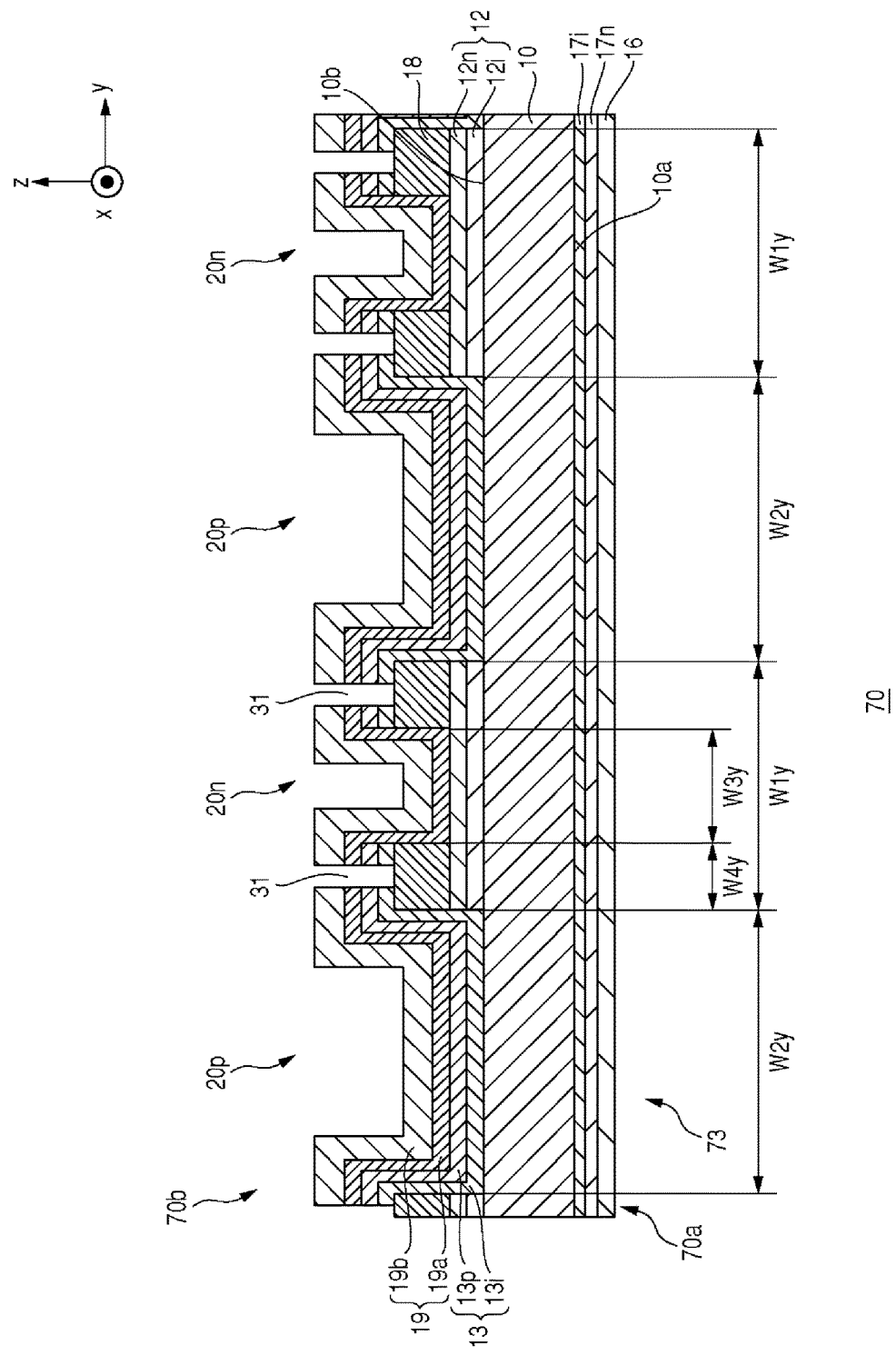
FIG. 3 is a sectional view of a structure of the solar cell according to the first embodiment.

FIG. 3 is a sectional view of the structure of the solar cell 70 according to the first embodiment and illustrates an A-A line cross section in FIG. 2. Although a cross section structure of the third sub-cell 73 is illustrated in FIG. 3, other sub-cells have similar structures.

The solar cell 70 includes a semiconductor substrate 10, a first conductivity type layer 12n, a first-type layer 12i, a second conductivity type layer 13p, a second i-type layer 13i, a first insulation layer 16, a third conductivity type layer 17n, a third-type layer 17i, a second insulation layer 18, and an electrode layer 19. The electrode layer 19 configures the n-side electrode 14, the p-side electrode 15, or the sub-electrode 20. The solar cell 70 is a back-contact type solar cell in which an amorphous semiconductor film is formed on a single crystal or polycrystalline semiconductor substrate.

The semiconductor substrate 10 includes a first principal surface 10a provided on a side of the light receiving surface 70a and a second principal surface 10b provided on a side of the back surface 70b. The semiconductor substrate 10 absorbs light which enters the first principal surface 10a and generates electrons and holes as a carrier. The semiconductor substrate 10 is formed of a crystalline semiconductor substrate having an n or p conductivity type. For example, a crystalline silicon (Si) substrate such as a single crystal silicon substrate and a polycrystalline silicon substrate is exemplified as a crystalline semiconductor substrate.

The present embodiment indicates a case where the semiconductor substrate 10 is formed of an n-type single crystal silicon substrate. A semiconductor substrate other than a single crystal semiconductor substrate may be used as the semiconductor substrate. For example, a semiconductor substrate of a compound semiconductor formed of gallium arsenide (GaAs) and indium phosphorus (InP) may be used.

Here, the light receiving surface 70a means a principal surface of the solar cell 70 to which light (sunlight) mainly enters, and specifically, is a surface where most part of the light which enters the solar cell 70 enters. On the other hand, the back surface 70b means the other principal surface opposed to the light receiving surface 70a.

On the first principal surface 10a of the semiconductor substrate 10, the third i-type layer 17i which is configured of a substantially intrinsic amorphous semiconductor (intrinsic semiconductor is referred to as "i-type layer" below) is provided. The third i-type layer 17i according to the present embodiment is formed of i-type amorphous silicon including hydrogen (H). The thickness of the third i-type layer 17i is not especially limited as long as the thickness does not substantially contribute to power generation. The thickness of the third i-type layer 17i can be, for example, about several Å to 250 Å.

In the present embodiment, the "amorphous semiconductor" includes a microcrystal semiconductor. The microcrystal semiconductor is a semiconductor of which an average particle diameter of crystal grains in the amorphous semiconductor is in a range of 1 nm to 50 nm.

The third conductivity type layer 17n having the same conductivity type as the semiconductor substrate 10 is formed on the third i-type layer 17i. N-type impurities are added to the third conductivity type layer 17n, and the third conductivity type layer 17n is an amorphous semiconductor layer having an n-type conductivity type. In the present embodiment, the third conductivity type layer 17n is formed of n-type amorphous silicon including hydrogen. The thickness of the third conductivity type layer 17n is not especially limited. The thickness of the third conductivity type layer 17n can be, for example, about 20 Å to 500 Å.

The first insulation layer 16 having a function as an antireflection film and a function as a protection film is formed on the third conductivity type layer 17n. For example, the first insulation layer 16 can be formed of silicon oxide ($SiO_2$), silicon nitride (SiN), and silicon oxide nitride (SiON). The thickness of the first insulation layer 16 can be appropriately set according to antireflection characteristics as the antireflection film. The thickness of the first insulation layer 16 can be, for example, about 80 nm to 1 μm.

Each of the third i-type layer 17i and the third conductivity type layer 17n has a function as a passivation layer of the semiconductor substrate 10. Also, a stacked structure of the first insulation layer 16 has a function as an antireflection film of the semiconductor substrate 10. The structure of the passivation layer provided on the first principal surface 10a of the semiconductor substrate 10 is not limited to this. For example, silicon oxide is formed on the first principal surface 10a of the semiconductor substrate 10, and silicon nitride may be formed thereon.

A first stacked body 12 and a second stacked body 13 are formed on the second principal surface 10b of the semiconductor substrate 10. The first stacked body 12 and the second stacked body 13 are alternately arranged in the y direction. Therefore, the first regions W1y in which the first stacked body 12 is provided and the second regions W2y in which the second stacked body 13 is provided interdigitate along the y direction. Also, the first stacked body 12 and the second stacked body 13 adjacent to each other in the y direction are provided as having contact with each other. Therefore, in the present embodiment, the whole of the second principal surface 10b is substantially covered with the first stacked body 12 and the second stacked body 13.

The first stacked body 12 is formed of a stacked body including the first i-type layer 12i which is formed on the second principal surface 10b and the first conductivity type layer 12n which is formed on the first-type layer 12i. Similarly to the third i-type layer 17i, the first-type layer 12i is formed of i-type amorphous silicon including hydrogen. The thickness of the first-type layer 12i is not especially limited as long as it does not substantially contribute to power generation. The thickness of the first i-type layer 12i can be, for example, about several Å to 250 Å.

Similarly to the third conductivity type layer 17n, n-type impurities are added to the first conductivity type layer 12n, and similarly to the semiconductor substrate 10, the first conductivity type layer 12n has an n-type conductivity type. Specifically, in the present embodiment, the first conductivity type layer 12n is formed of n-type amorphous silicon including hydrogen. The thickness of the first conductivity type layer 12n is not especially limited. The thickness of the first conductivity type layer 12n can be, for example, about 20 Å to 500 Å.

The second insulation layer 18 is formed on the first stacked body 12. The second insulation layers 18 are not provided in the third region W3y corresponding to a center part of the first region W1y in the y direction and are provided in the fourth regions W4y corresponding to both sides of the third region W3y. It is preferable that the width of the third region W3y be wider. For example, the width of the third region W3y can be set in a range larger than one third of the width of the first region W1y and smaller than the width of the first region W1y.

The material of the second insulation layer 18 is not especially limited. For example, the second insulation layer 18 can be formed of silicon oxide, silicon nitride, and silicon oxide nitride. Among them, it is preferable that the second insulation layer 18 be formed of silicon nitride. Also, it is preferable that the second insulation layer 18 include hydrogen.

The second stacked body 13 is formed on the second region W2y of the second principal surface 10b where the first stacked body 12 is not provided and on an end part of the fourth region W4y where the second insulation layer 18 is provided. Therefore, both end parts of the second stacked body 13 are provided as overlapping with the first stacked body 12 in the height direction (z direction).

The second stacked body 13 is formed of a stacked body including the second i-type layer 13i which is formed on the second principal surface 10b and the second conductivity type layer 13p which is formed on the second i-type layer 13i.

The second-type layer 13i is formed of i-type amorphous silicon including hydrogen. The thickness of the second i-type layer 13i is not especially limited as long as it does not substantially contribute to power generation. The thickness of the second i-type layer 13i can be, for example, about several Å to 250 Å.

P-type impurities are added to the second conductivity type layer 13p, and the second conductivity type layer 13p is an amorphous semiconductor layer having a p-type conductivity type. Specifically, in the present embodiment, the second conductivity type layer 13p is formed of p-type amorphous silicon including hydrogen. The thickness of the second conductivity type layer 13p is not especially limited. The thickness of the second conductivity type layer 13p can be, for example, about 20 Å to 500 Å.

In this way, in the present embodiment, the second i-type layer 13i having the thickness which does not substantially contribute to the power generation is provided between the crystalline semiconductor substrate 10 and the second conductivity type layer 13p. By employing this structure, recombination of carries on a junction interface between the semiconductor substrate 10 and the second stacked body 13 can be prevented. As a result, photoelectric conversion efficiency can be improved. In the present embodiment, an example of a solar cell for forming a pn junction by forming amorphous silicon having a p-type or n-type conductivity type on the crystalline semiconductor substrate has been indicated. However, a solar cell in which a pn junction is formed by diffusing the impurity to the crystalline semiconductor substrate may be used.

In the present embodiment, the photoelectric converter includes the semiconductor substrate 10, the first stacked body 12, and the second stacked body 13. Also, the first region W1y where the semiconductor substrate 10 has contact with the first stacked body 12 is the n-type region, and the second region W2y where the semiconductor substrate 10 has contact with the second stacked body 13 is the p-type region.

Also, in the present embodiment, since the semiconductor substrate having the n-type conductivity type is used as the semiconductor substrate 10, the electrons are the majority carriers, and the holes are the minority carriers. Therefore, in the present embodiment, power generation efficiency is improved by making the width of the second region W2y where the minority carriers are collected wider than the width of the third region W3y where the majority carriers are corrected.

The n-side part 20n of the sub-electrode 20 for collecting the electrons is formed on the first conductivity type layer 12n. On the other hand, the p-side part 20p of the sub-electrode 20 for collecting the holes is formed on the second conductivity type layer 13p. The isolation groove 31 is formed between the n-side part 20n and the p-side part 20p. Therefore, the n-side part 20n and the p-side part 20p which are formed on a single sub-cell are isolated by the isolation groove 31, an electric resistance between both the electrodes is increased, or both electrodes are electrically insulated.

In a case of the first sub-cell 71, instead of the n-side part 20n, the n-side electrode is formed on the first conductivity type layer 12n. Also, in a case of the fourth sub-cell 74, instead of the p-side part 20p, the p-side electrode is formed on the second conductivity type layer 13p. In this case, the isolation groove 31 isolates between the n-side electrode 14 and the sub-electrode 20 and between the p-side electrode 15 and the sub-electrode 20.

In the present embodiment, an electrode is formed of a stacked body including two conductive layers, i.e., a first conductive layer 19a and a second conductive layer 19b. The first conductive layer 19a is formed of, for example, transparent conductive oxide (TCO) in which tin oxide ($SnO_2$), zinc oxide (ZnO), and indium tin oxide (ITO) are doped with tin (Sn), antimony (Sb), fluorine (F), and aluminum (Al). In the present embodiment, the first conductive layer 19a is a transparent electrode layer formed of indium tin oxide. The thickness of the first conductive layer 19a can be, for example, about 50 to 100 nm. In the present embodiment, the first conductive layer 19a is formed by using a thin film forming method such as sputtering and chemical vapor deposition (CVD).

The second conductive layer 19b is a metal electrode layer including metal such as copper (Cu) and tin (Sn). However, the material is not limited to this, and the metal electrode layer may include other metal such as gold (Au) and silver (Ag), other conductive material, or a combination of them. In the present embodiment, the second conductive layer 19b has a three-layer structure in which a copper layer and a tin layer formed by using a plating method are stacked on a base layer of copper formed by sputtering. The thicknesses of respective films can be about 50 nm to 1 μm, about 10 μm to 20 μm, and about 1 μm to 5 μm.

The structure of the electrode layer 19 is not limited to the stacked body with the first conductive layer 19a. For example, a structure may be formed by providing the second conductive layer 19b formed of a metal layer without providing the first conductive layer 19a formed of transparent conductive oxide.

Figure 4:
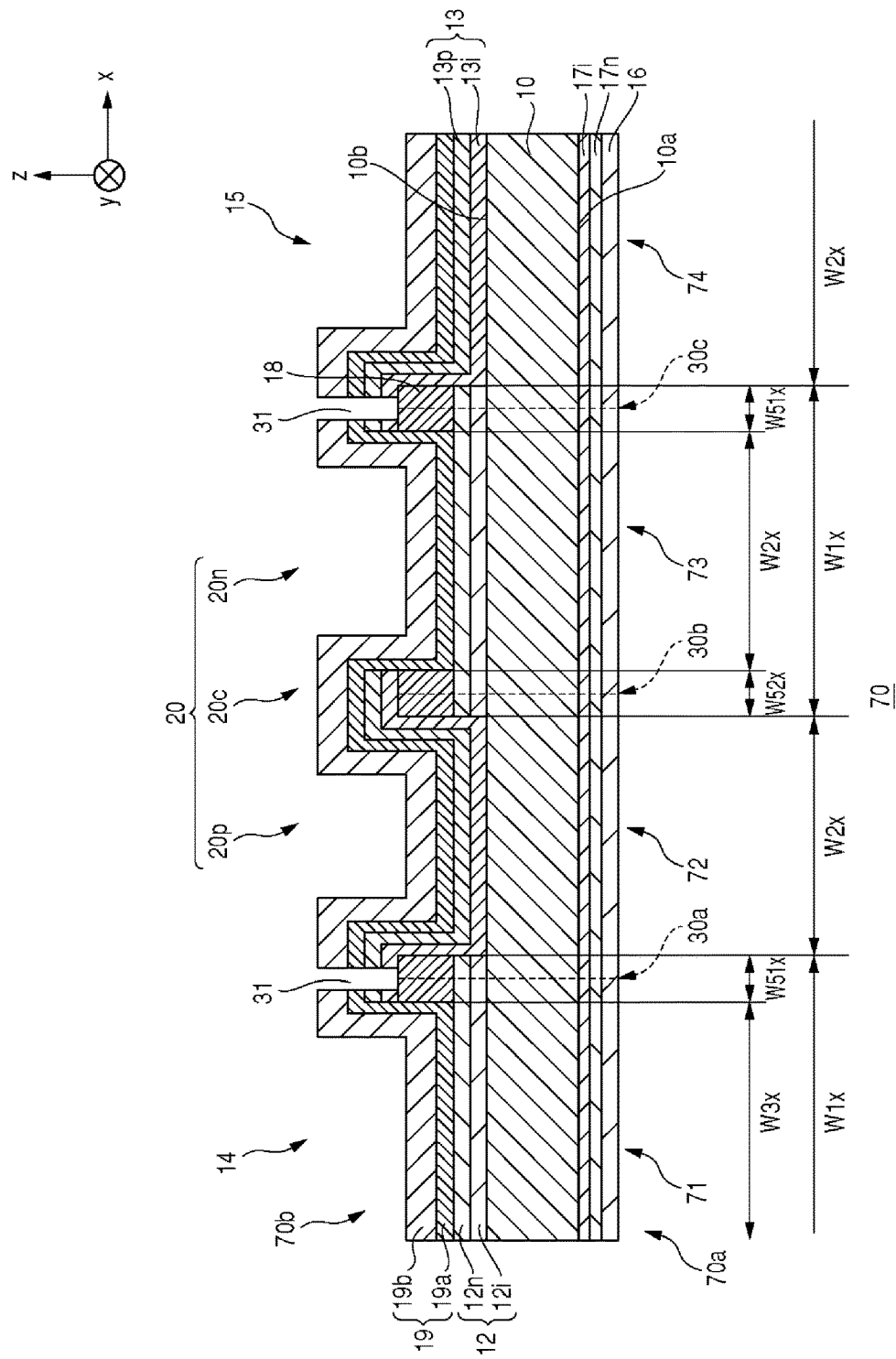
FIG. 4 is a sectional view of the structure of the solar cell according to the first embodiment.

FIG. 4 is a sectional view of a structure of the solar cell 70 according to the first embodiment and illustrates a B-B line cross section in FIG. 2. In FIG. 4, the structures of the boundaries 30a, 30b, and 30c for dividing the solar cell 70 into the plurality of sub-cells 71 to 74 are illustrated.

The first stacked body 12 and the second stacked body 13 provided on the second principal surface 10b of the semiconductor substrate 10 are alternately arranged in the x direction while sandwiching the second insulation layers 18 positioned in the isolation regions W51x and W52x. In FIG. 4, a cross section is illustrated in which the third regions to be the n-type region are positioned at the positions of the first sub-cell 71 and the third sub-cell 73 and the second regions to be the p-type region are positioned at the positions of the second sub-cell 72 and the fourth sub-cell 74. Therefore, the n-type regions and the p-type regions are provided so as to be opposed to each other in the x direction while sandwiching the isolation regions W51x and W52x.

The boundaries 30a to 30c are provided in the isolation regions W51x and W52x where the second insulation layers 18 are provided. In the boundaries 30a and 30c provided in the first isolation regions W51x, the isolation groove 31 for isolating the n-side electrode 14 from the sub-electrode 20 or the isolation groove 31 for isolating the p-side electrode 15 from the sub-electrode 20 is provided. On the other hand, the isolation groove is not provided in the boundary 30b provided in the second isolation region W52x. Therefore, the electrode layer 19 which is left in the second isolation region W52x becomes the connection part 20c for connecting the adjacent sub-cells to each other.

Next, a manufacturing method for the solar cell 70 according to the present embodiment will be described with reference to FIGS. 5 to 17. In the present embodiment, cross section structures to be formed are different from each other according to the direction. Therefore, the manufacturing method for the solar cell 70 will be described as indicating the cross sections in the x direction and the y direction.

Figure 5:
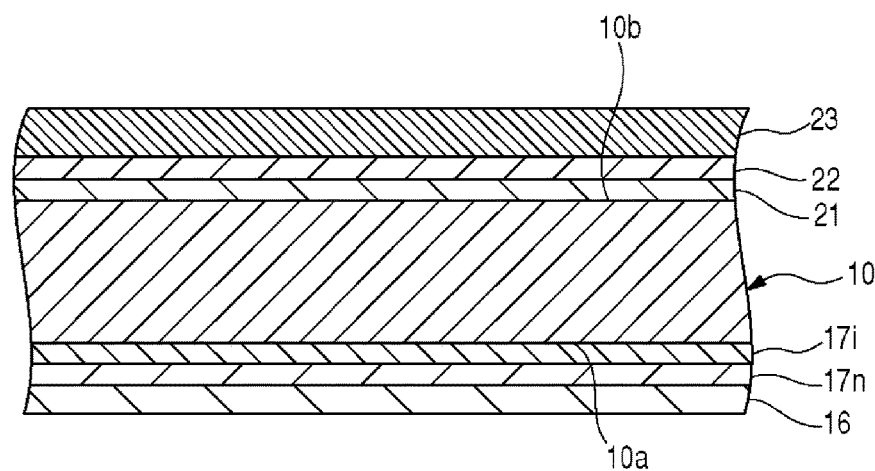
FIG. 5 is a schematic sectional view of a manufacturing process for the solar cell.

First, the semiconductor substrate 10 illustrated in FIG. 5 is prepared, and the first principal surface 10a and the second principal surface 10b of the semiconductor substrate 10 are cleaned. For example, the semiconductor substrate 10 can be cleaned by using hydrofluoric (HF) acid solution. In this cleaning process, it is preferable to form a texture structure on the first principal surface 10a.

Next, an i-type amorphous semiconductor layer to be the third i-type layer 17i, an n-type amorphous semiconductor layer to be the third conductivity type layer 17n, and an insulation layer to be the first insulation layer 16 are formed on the first principal surface 10a of the semiconductor substrate 10. Also, an i-type amorphous semiconductor layer 21, an n-type amorphous semiconductor layer 22, and an insulation layer 23 are formed on the second principal surface 10b of the semiconductor substrate 10. Forming methods for the third-type layer 17i, the third conductivity type layer 17n, the i-type amorphous semiconductor layer 21, and the n-type amorphous semiconductor layer 22 are not especially limited. However, for example, these layers can be formed by using the chemical vapor deposition (CVD) method such as a plasma CVD method. Also, forming methods for the first insulation layer 16 and the insulation layer 23 are not especially limited. However, for example, these layers can be formed by using a thin film forming method such as a sputtering method and a CVD method.

Figure 6:
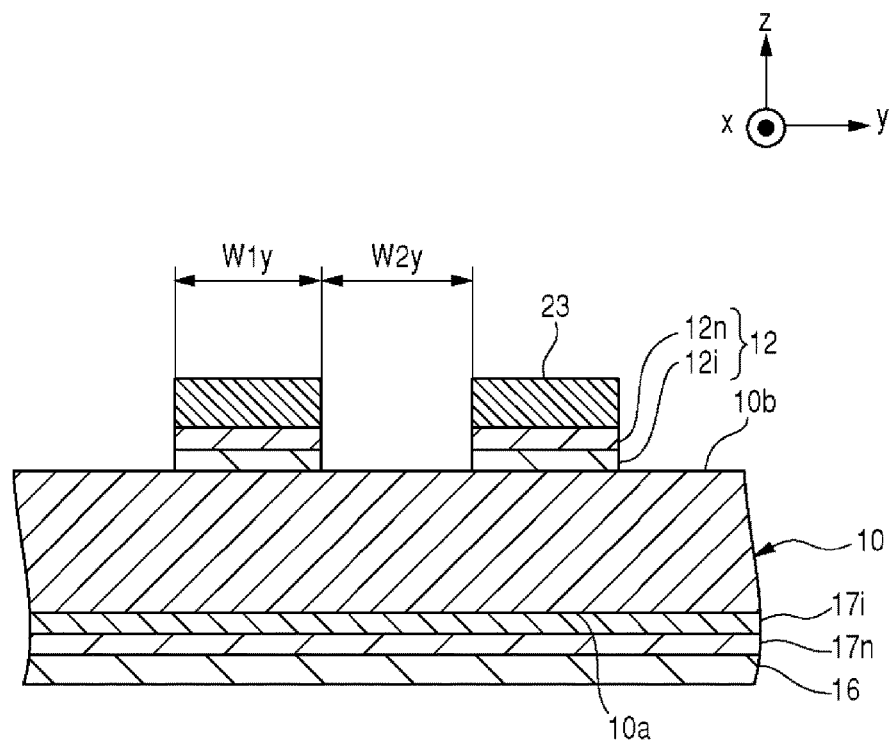
FIG. 6 is a schematic sectional view of the manufacturing process for the solar cell in a y direction.
Figure 7:
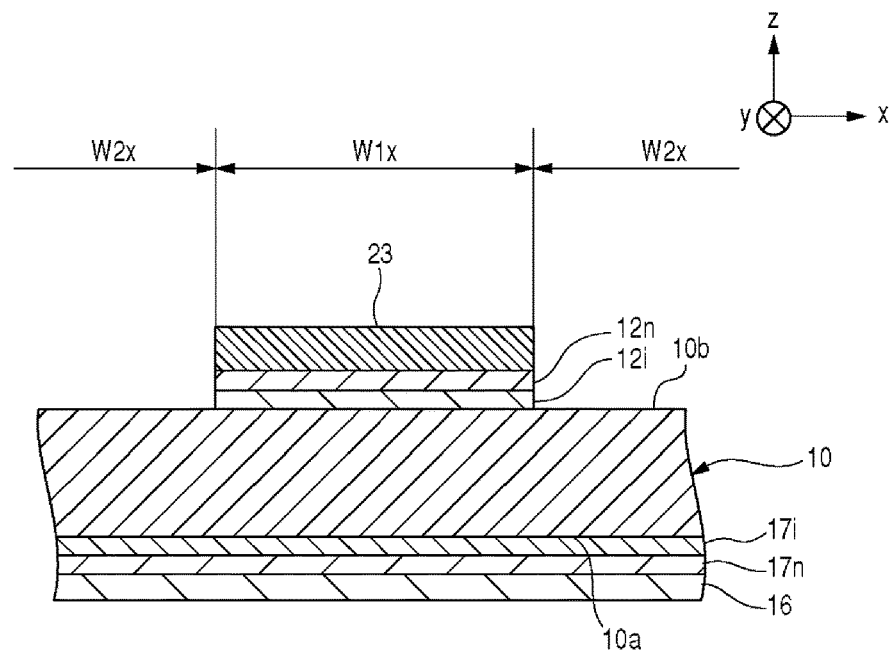
FIG. 7 is a schematic sectional view of the manufacturing process for the solar cell in an x direction.

Next, as illustrated in FIGS. 6 and 7, a part of the insulation layer 23 is removed by performing etching to the insulation layer 23. Specifically, a part of the insulation layer 23 positioned in the second regions W2y and W2x where a p-type semiconductor layer is formed on the semiconductor substrate 10 in the following process is removed. When the insulation layer 23 is formed of silicon oxide, silicon nitride, or silicon oxide nitride, etching can be performed to the insulation layer 23 by providing a resist mask on the parts positioned in the first regions W1y and W1x by using acid etchant such as hydrofluoric acid solution. FIG. 6 is a sectional view along the y direction and corresponds to the A-A line cross section in FIG. 2. FIG. 7 is a sectional view along the x direction and corresponds to the B-B line cross section in FIG. 2.

Next, by using the patterned insulation layer 23 as a mask, etching is performed to the i-type amorphous semiconductor layer 21 and the n-type amorphous semiconductor layer 22 by using alkali etchant. By the etching, parts of the i-type amorphous semiconductor layer 21 and the n-type amorphous semiconductor layer 22 positioned in the second regions W2y and W2x which are not covered with the insulation layer 23 in the i-type amorphous semiconductor layer 21 and the n-type amorphous semiconductor layer 22 are removed. According to this, in the second principal surface 10b, the second regions W2y and W2x on which the insulation layer 23 is not provided are exposed. The regions where the first stacked body 12 remains are the first regions W1y and W1x.

Figure 8:
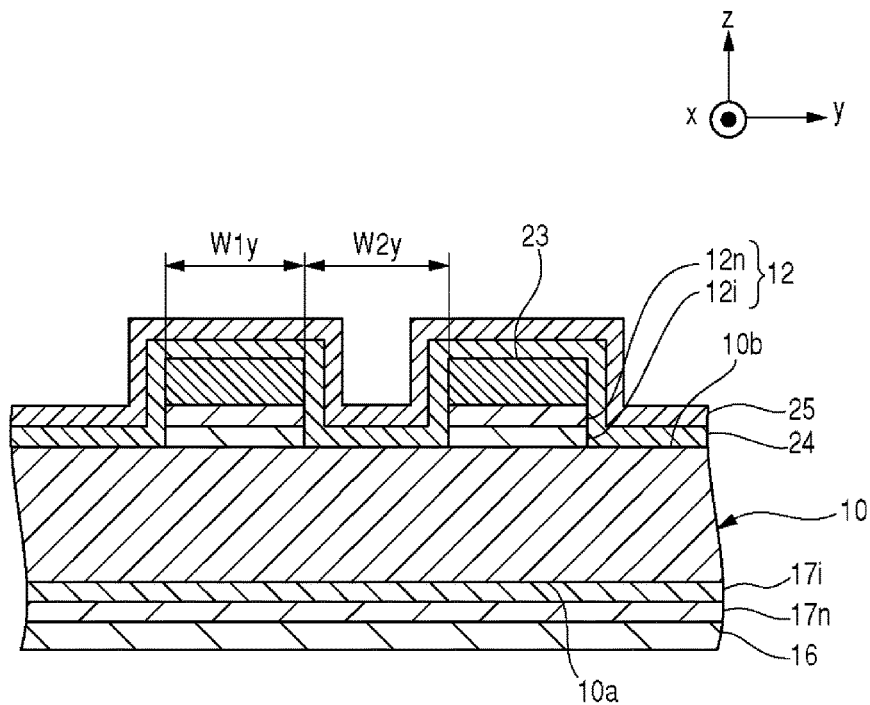
FIG. 8 is a schematic sectional view of the manufacturing process for the solar cell in the y direction.
Figure 9:
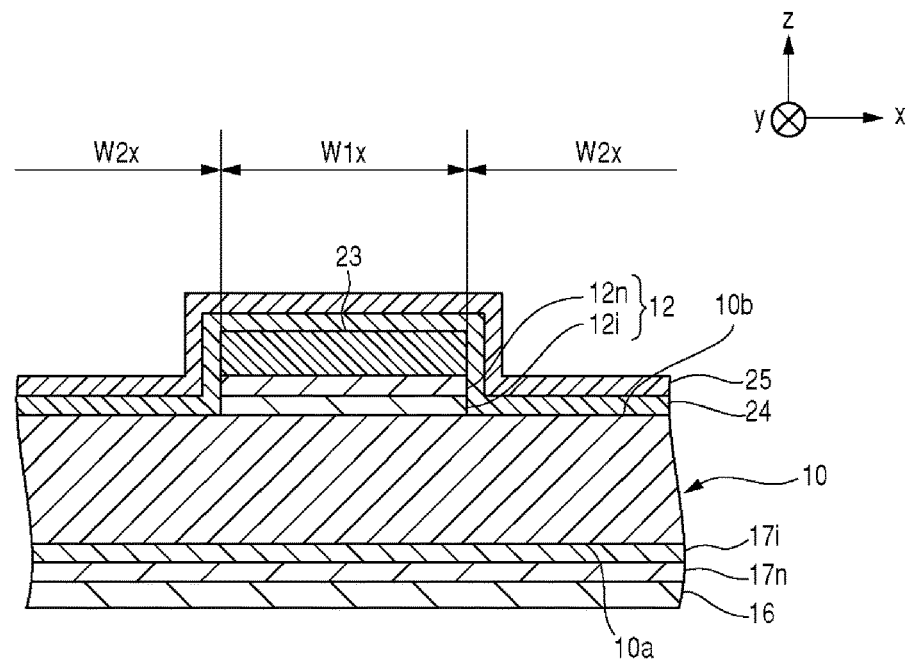
FIG. 9 is a schematic sectional view of the manufacturing process for the solar cell in the x direction.

Next, as illustrated in FIGS. 8 and 9, the i-type amorphous semiconductor layer 24 is formed so as to cover the second principal surface 10b, and a p-type amorphous semiconductor layer 25 is formed on the i-type amorphous semiconductor layer 24. Forming methods for the i-type amorphous semiconductor layer 24 and the p-type amorphous semiconductor layer 25 are not especially limited. However, these layers can be formed by using a thin film forming method such as a CVD method.

Figure 10:
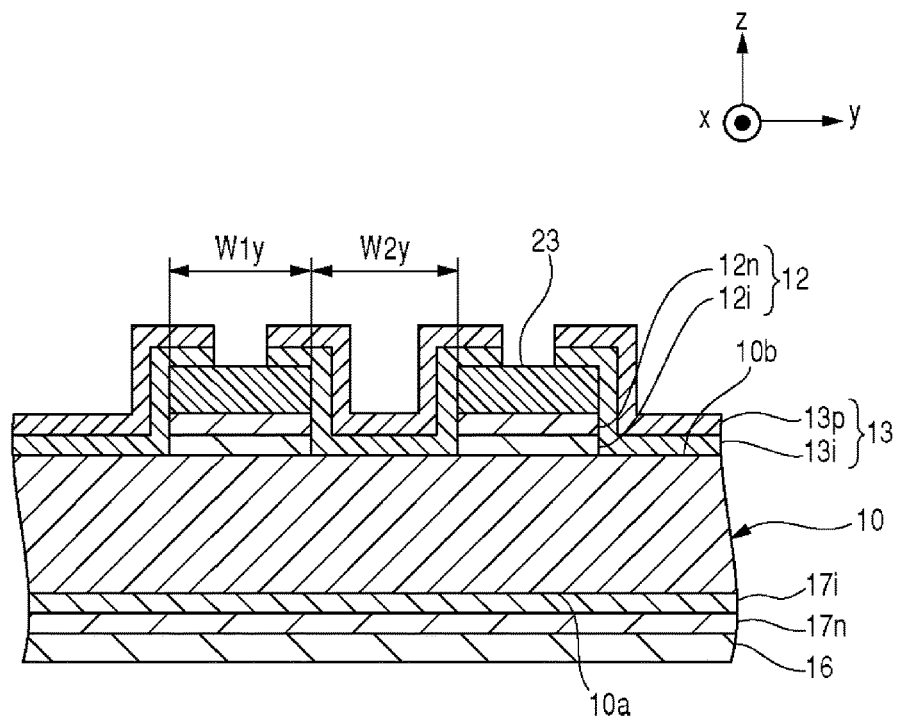
FIG. 10 is a schematic sectional view of the manufacturing process for the solar cell in the y direction.
Figure 11:
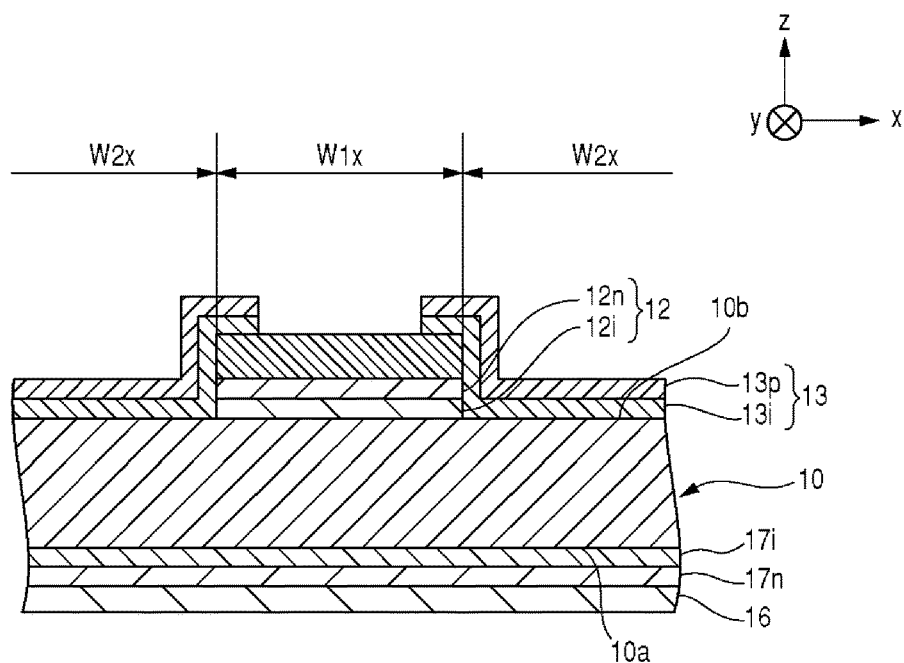
FIG. 11 is a schematic sectional view of the manufacturing process for the solar cell in the x direction.

Next, as illustrated in FIGS. 10 and 11, etching is performed to parts positioned on the insulation layer 23 in the i-type amorphous semiconductor layer 24 and the p-type amorphous semiconductor layer 25. Accordingly, the second i-type layer 13i is formed from the i-type amorphous semiconductor layer 24, and the second conductivity type layer 13p is formed from the p-type amorphous semiconductor layer 25.

Figure 12:
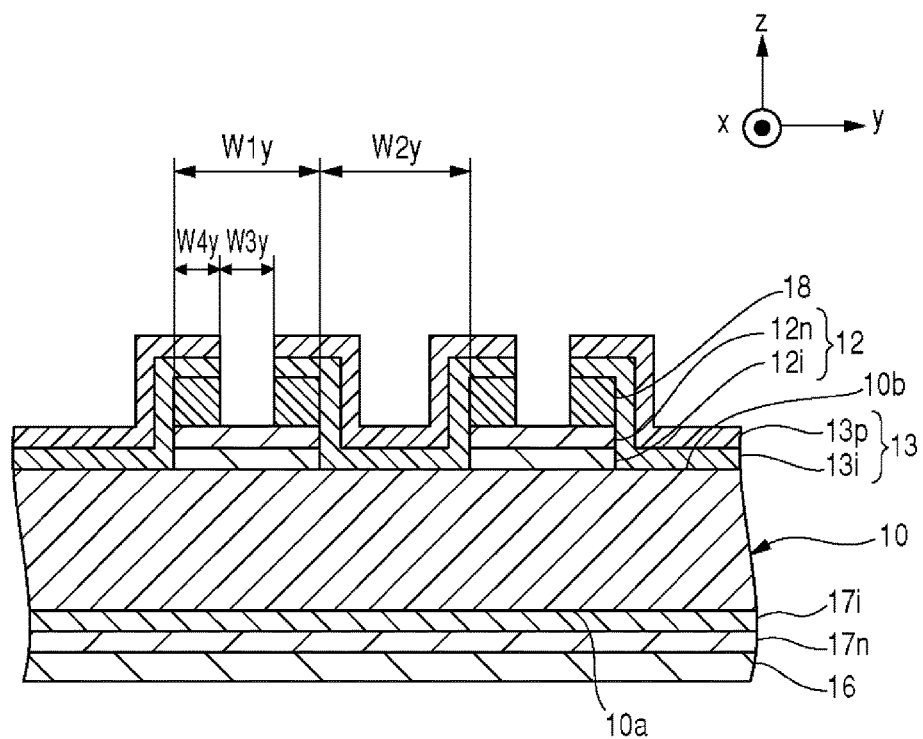
FIG. 12 is a schematic sectional view of the manufacturing process for the solar cell in the y direction.
Figure 13:
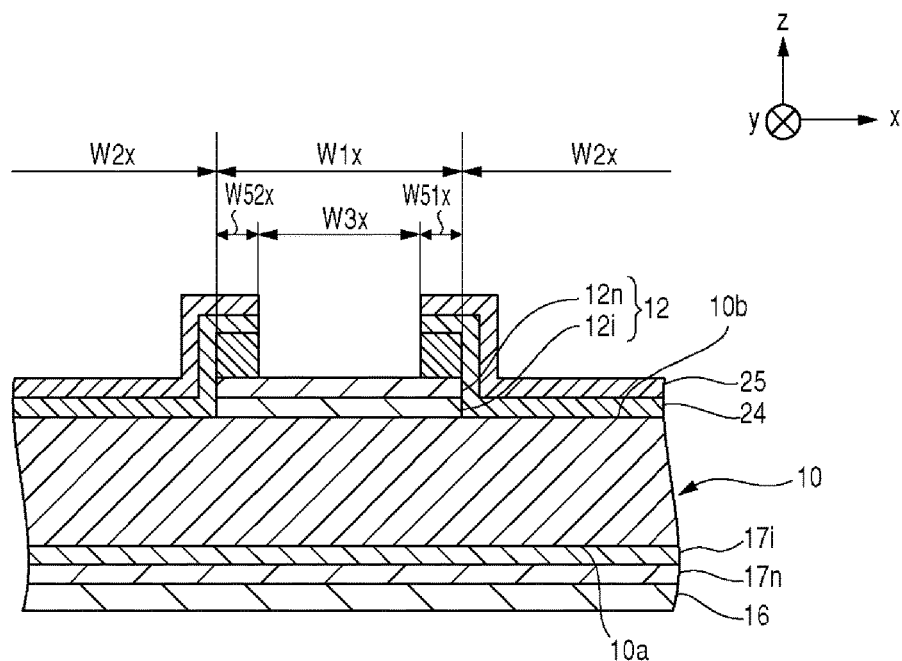
FIG. 13 is a schematic sectional view of the manufacturing process for the solar cell in the x direction.

Next, as illustrated in FIGS. 12 and 13, etching is performed to the insulation layer 23. Specifically, the parts where the insulation layer 23 is exposed on the second i-type layer 13i and the second conductivity type layer 13p are removed by the etching. According to this, the first conductivity type layer 12n is exposed by forming a contact hole in the insulation layer 23, and the second insulation layer 18 is formed from the insulation layer 23. As illustrated in FIG. 12, on the cross section in the y direction, a region where the insulation layer 23 has been removed becomes the third region W3y, and a region where the second insulation layer 18 remains becomes the fourth region W4y. On the other hand, as illustrated in FIG. 13, on the cross section in the x direction, a region where the insulation layer 23 has been removed becomes the third region W3x, and regions where the second insulation layer 18 remains become the isolation regions W51x and W52x.

Figure 14:
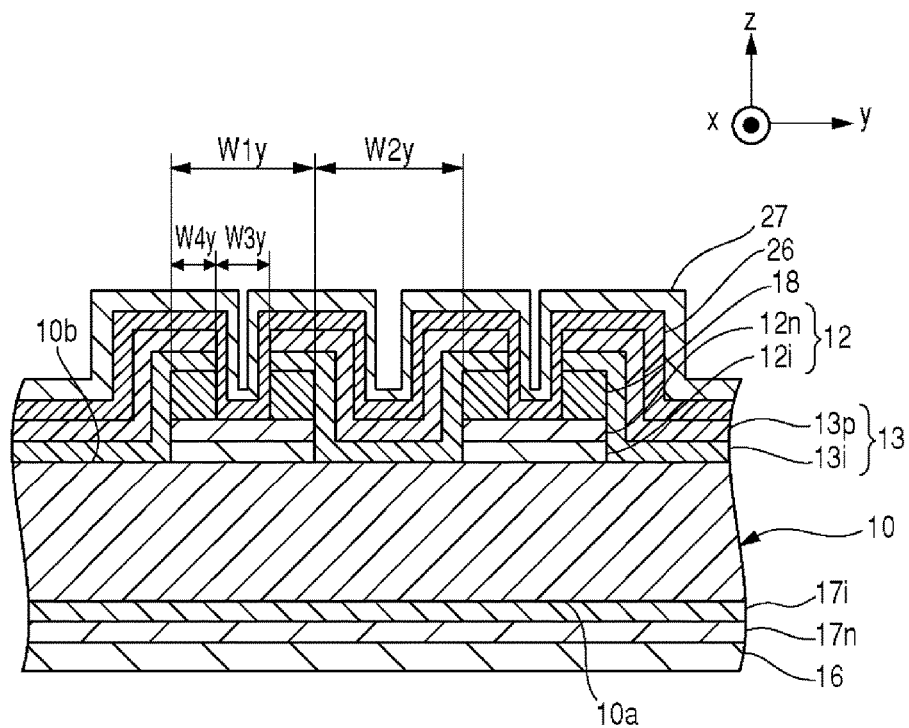
FIG. 14 is a schematic sectional view of the manufacturing process for the solar cell in the y direction.
Figure 15:
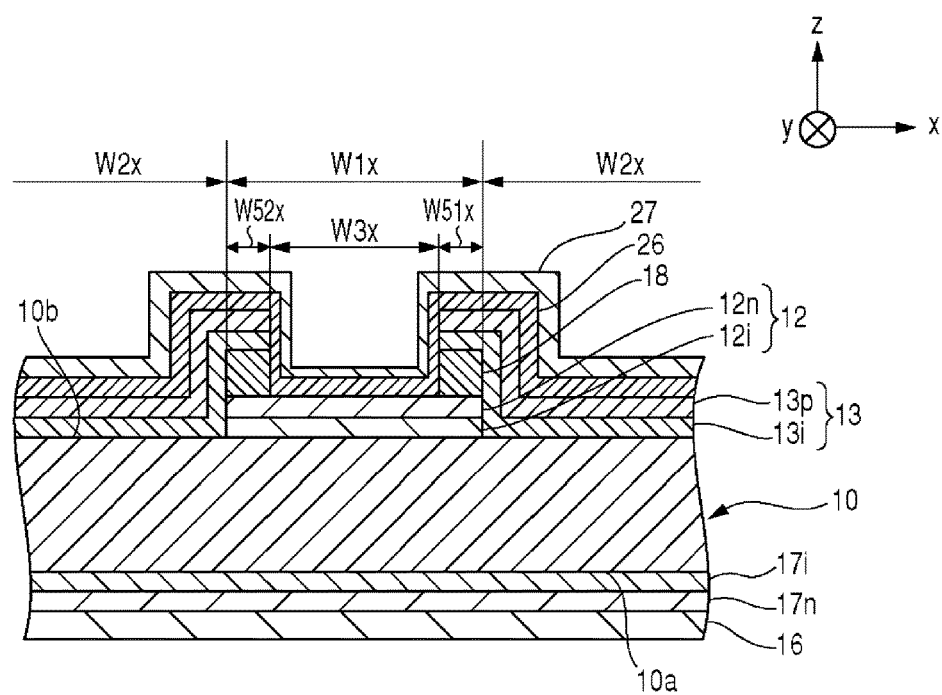
FIG. 15 is a schematic sectional view of the manufacturing process for the solar cell in the x direction.

Next, as illustrated in FIGS. 14 and 15, conductive layers 26 and 27 are respectively formed on the first conductivity type layer 12n and the second conductivity type layer 13p. The conductive layer 26 is a transparent electrode layer formed of indium tin oxide (ITO) and the like, and the conductive layer 27 is a metal electrode layer formed of metal such as copper (Cu) and alloy. The conductive layers 26 and 27 are formed by using a thin film forming method including a CVD method such as a plasma CVD method and a sputtering method. The conductive layer 27 may make the film thickness of the electrode thick by forming the electrode by using the plating method on the metal electrode layer formed by using the thin film forming method.

Figure 16:
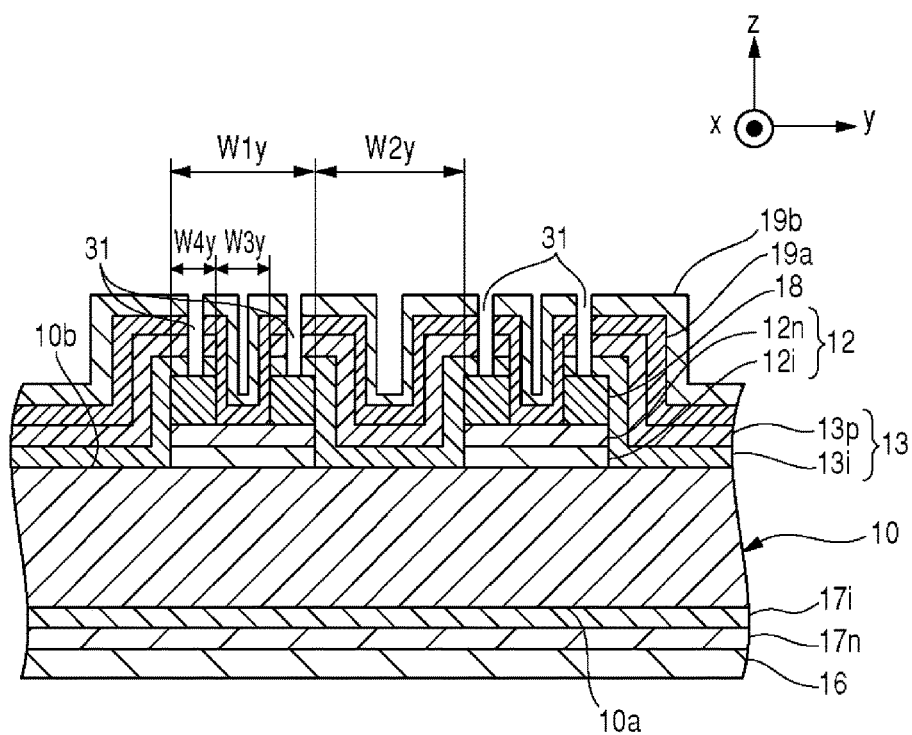
FIG. 16 is a schematic sectional view of the manufacturing process for the solar cell in the y direction.
Figure 17:
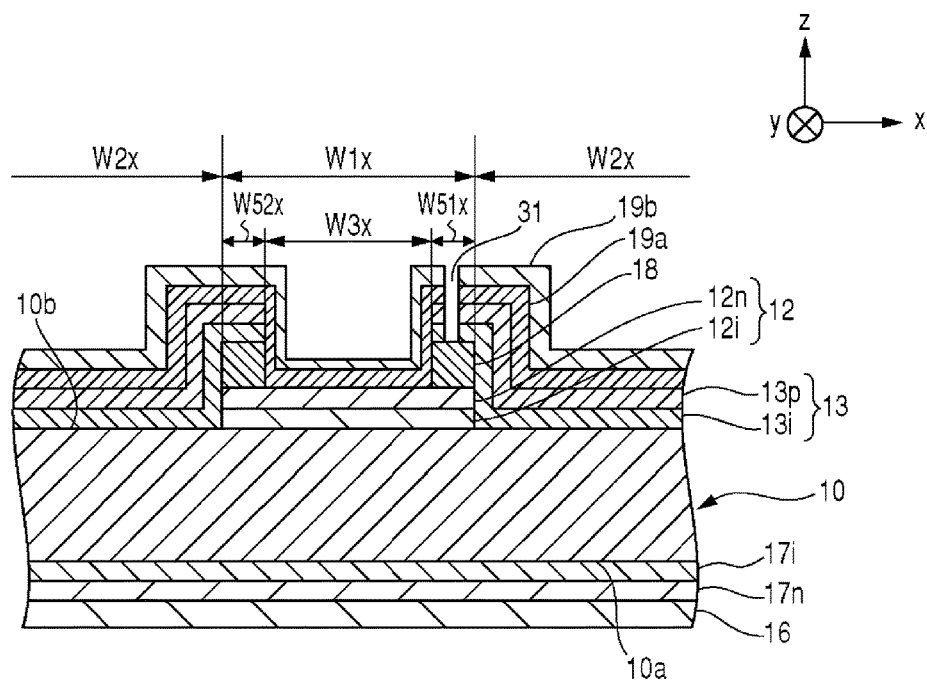
FIG. 17 is a schematic sectional view of the manufacturing process for the solar cell in the x direction.

Next, as illustrated in FIGS. 16 and 17, in the conductive layers 26 and 27, the isolation groove 31 is formed by dividing a part positioned on the second insulation layer 18. According to this, the first conductive layer 19a and the second conductive layer 19b are formed from the conductive layers 26 and 27, and the n-type electrode, the p-side electrode, and the sub-electrode are separated from each other. For example, the conductive layers 26 and 27 can be divided by using a photolithography method. The isolation grooves 31 are provided at positions corresponding to the fourth region W4y illustrated in FIG. 16 and the first isolation region W51x illustrated in FIG. 17. On the other hand, the isolation groove 31 is not provided at a position corresponding to the second isolation region W52x illustrated in FIG. 17.

According to the above manufacturing process, the solar cell 70 illustrated in FIGS. 3 and 4 can be formed.

Subsequently, an effect of the solar cell 70 according to the present embodiment will be described.

Figure 18:
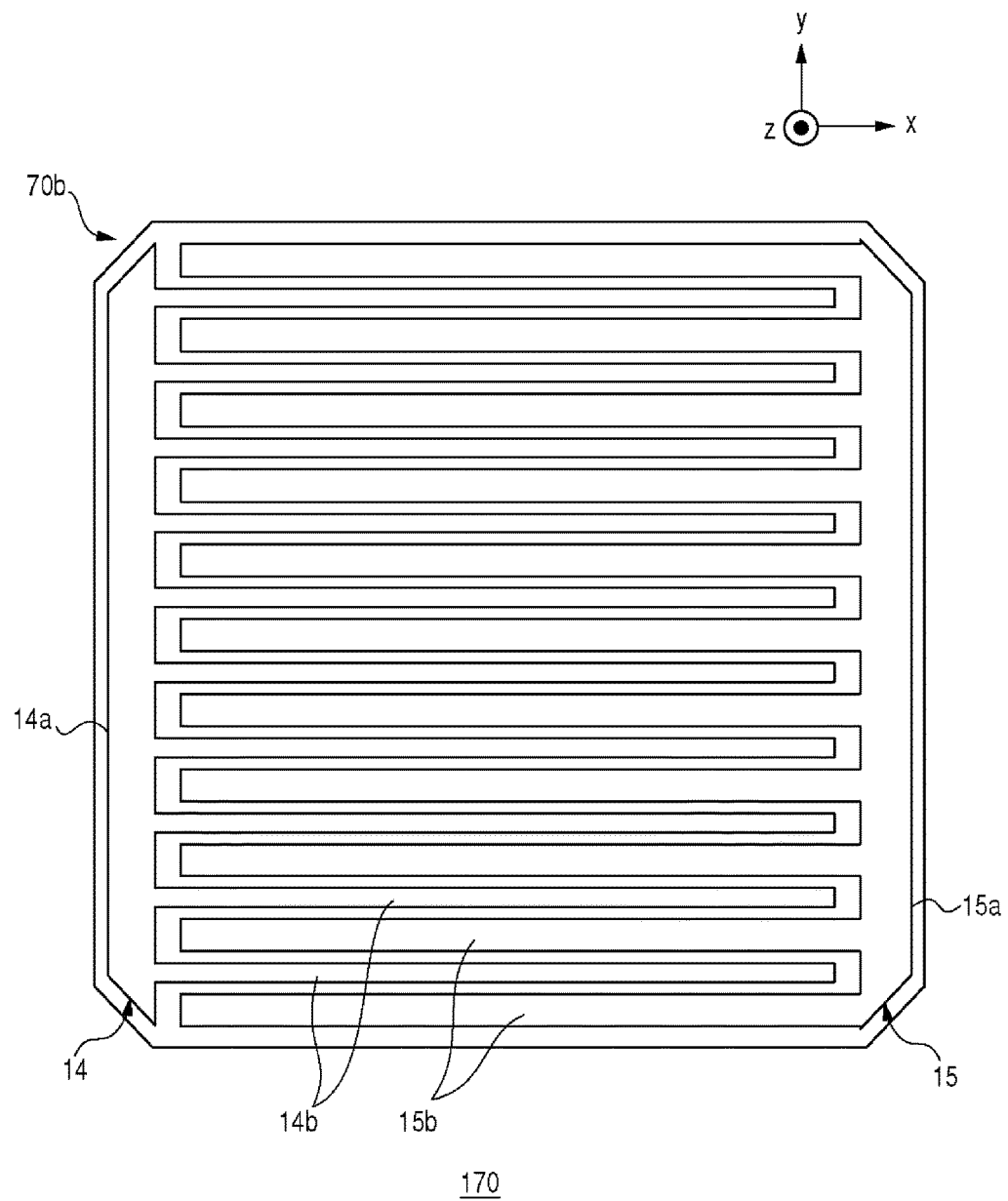
FIG. 18 is a plan view of a solar cell according to a comparative example.

FIG. 18 is a plan view of a solar cell 170 according to a comparative example. The solar cell 170 is a back-contact type solar cell and includes the n-side electrode 14 and the p-side electrode 15 provided on the back surface 70b. The n-side electrode 14 is formed in a comb shape which includes a bus bar electrode 14a extended in the y direction and a plurality of finger electrodes 14b extended in the x direction. Similarly, the p-side electrode 15 is formed in a comb shape including the bus bar electrode 15a extended in the y direction and the plurality of finger electrodes 15b extended in the x direction. The n-side electrode 14 and the p-side electrode 15 are formed so that comb teeth of each one interdigitate each other. A region where the pn junction is increased and the power generation efficiency is improved by forming the comb shape electrode and forming the n-type region and the p-type region in a comb shape corresponding to an electrode pattern.

On the other hand, when the n-side electrode 14 and the p-side electrode 15 are formed in a comb shape, the finger electrodes 14b and 15b are extended longer in the x direction. As a result, there has been a possibility that the current collecting efficiency is lowered by the increase in the resistance values of the finger electrodes 14b and 15b.

In the present embodiment, as illustrated in FIG. 2, since the solar cell 70 is divided into a plurality of sub-cells 71 to 74, the lengths of the finger electrodes 14b and 15b extended in the x direction can be reduced. According to this, compared with a case where the finger electrodes 14b and 15b are formed to be long, the current collecting efficiency can be improved by lowering the resistance values of the finger electrodes 14b and 15b. According to this, the power generation efficiency of the solar cell 70 can be improved.

Also, in the present embodiment, the sub-electrodes 20 which connect the adjacent sub-cells to each other are collectively formed in a process for forming the n-side electrode 14 and the p-side electrode 15. When the plurality of solar cells, in which the extended length of the finger electrode is reduced, is used, it is necessary to provide another process for connecting the solar cells by using a wiring material and the like after the solar cell has been produced. However, in the present embodiment, another process for connecting the sub-cells can be omitted. Therefore, the solar cell with improved current collecting efficiency can be manufactured as preventing the increase in the manufacturing cost.

The outline of an aspect is as follows. A solar cell 70 of one aspect includes a photoelectric converter including a light receiving surface 70a and a back surface 70b opposed to the light receiving surface 70a and an electrode layer 19 provided on the back surface 70b. N-type regions and p-type regions are alternately arranged in a first direction (y direction) on the back surface 70b. The photoelectric converter includes a plurality of sub-cells 71 to 74 arranged in a second direction (x direction) intersecting with the first direction and an isolation region W5x provided on a boundary between adjacent sub-cells. An electrode layer 19 includes an n-side electrode 14 provided on the n-type region in the sub-cell 71 at the end of the plurality of sub-cells 71 to 74, a p-side electrode 15 provided on the p-type region in the sub-cell 74 at the other end, and a sub-electrode 20 provided over the two adjacent sub-cells. The sub-electrode 20 connects the n-type region provided on one sub-cell from among the two adjacent sub-cells to the p-type region provided on the other sub-cell.

The n-side electrode 14 and the p-side electrode 15 may respectively include bus bar electrodes 14a and 15a extended in the first direction and a plurality of finger electrodes 14b and 15b which are respectively branched from the bus bar electrodes 14a and 15a and extended in the second direction.

Second Embodiment

A structure of a solar cell 70 according to the present embodiment will be described in detail with reference to FIGS. 19 to 21. The solar cell 70 according to the present embodiment is different from that in the first embodiment in that a semiconductor substrate 10 is physically divided by providing grooves in boundaries 30a, 30b, and 30c between sub-cells 71 to 74. By dividing the semiconductor substrate 10 at the boundary 30, power generation efficiency of the solar cell 70 can be further improved. A difference from the first embodiment will be mainly described below.

Figure 19:
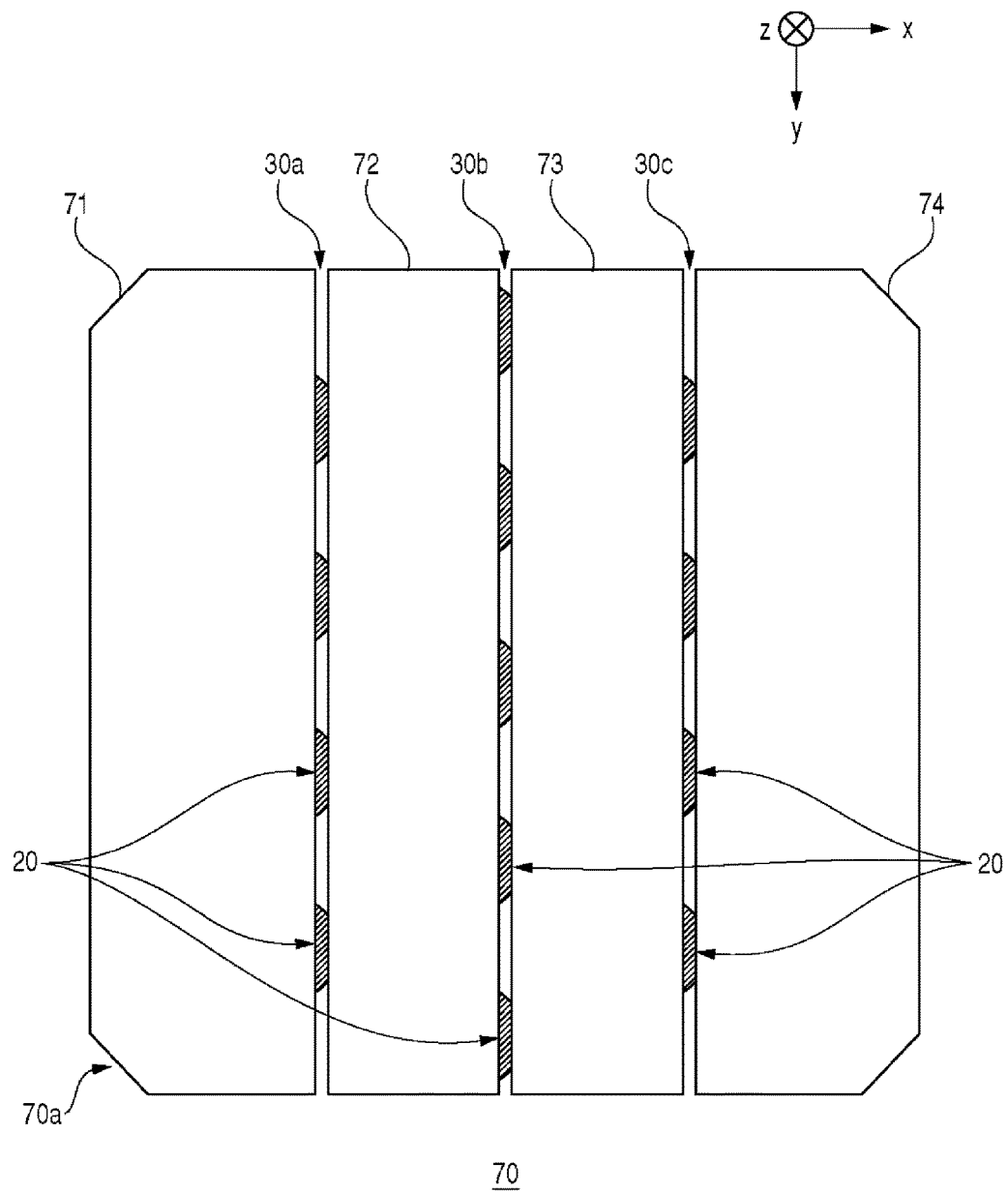
FIG. 19 is a plan view of a solar cell according to a second embodiment.
Figure 20:
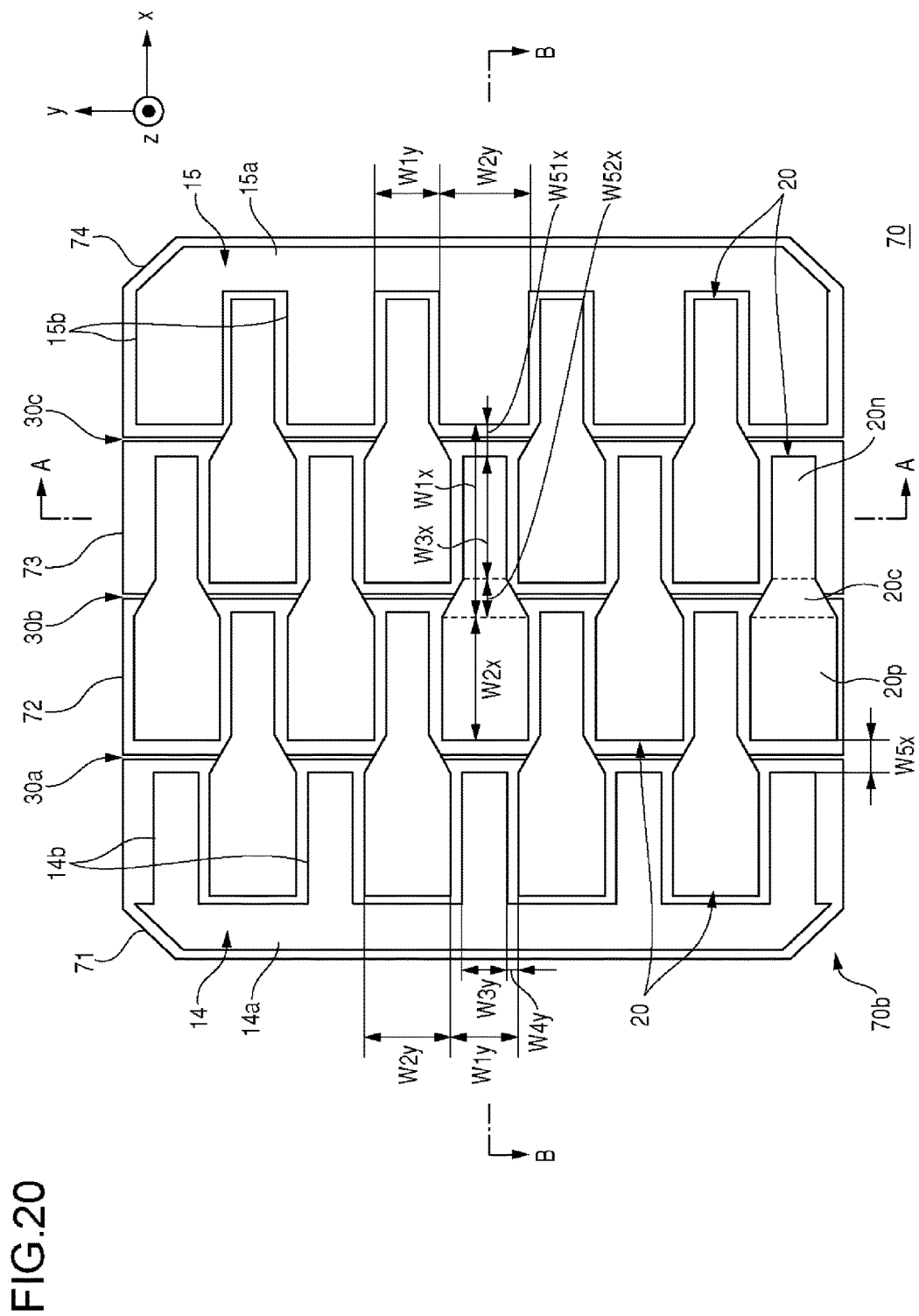
FIG. 20 is a plan view of the solar cell according to the second embodiment.

FIGS. 19 and 20 are plan views of the solar cell 70 according to the second embodiment. FIG. 19 is a diagram of a light receiving surface 70a of the solar cell 70, and FIG. 20 is a diagram of a back surface 70b of the solar cell 70. In the present embodiment, the grooves are provided in the boundaries 30a to 30c, and the sub-cells 71 to 74 are divided by the grooves.

Figure 21:
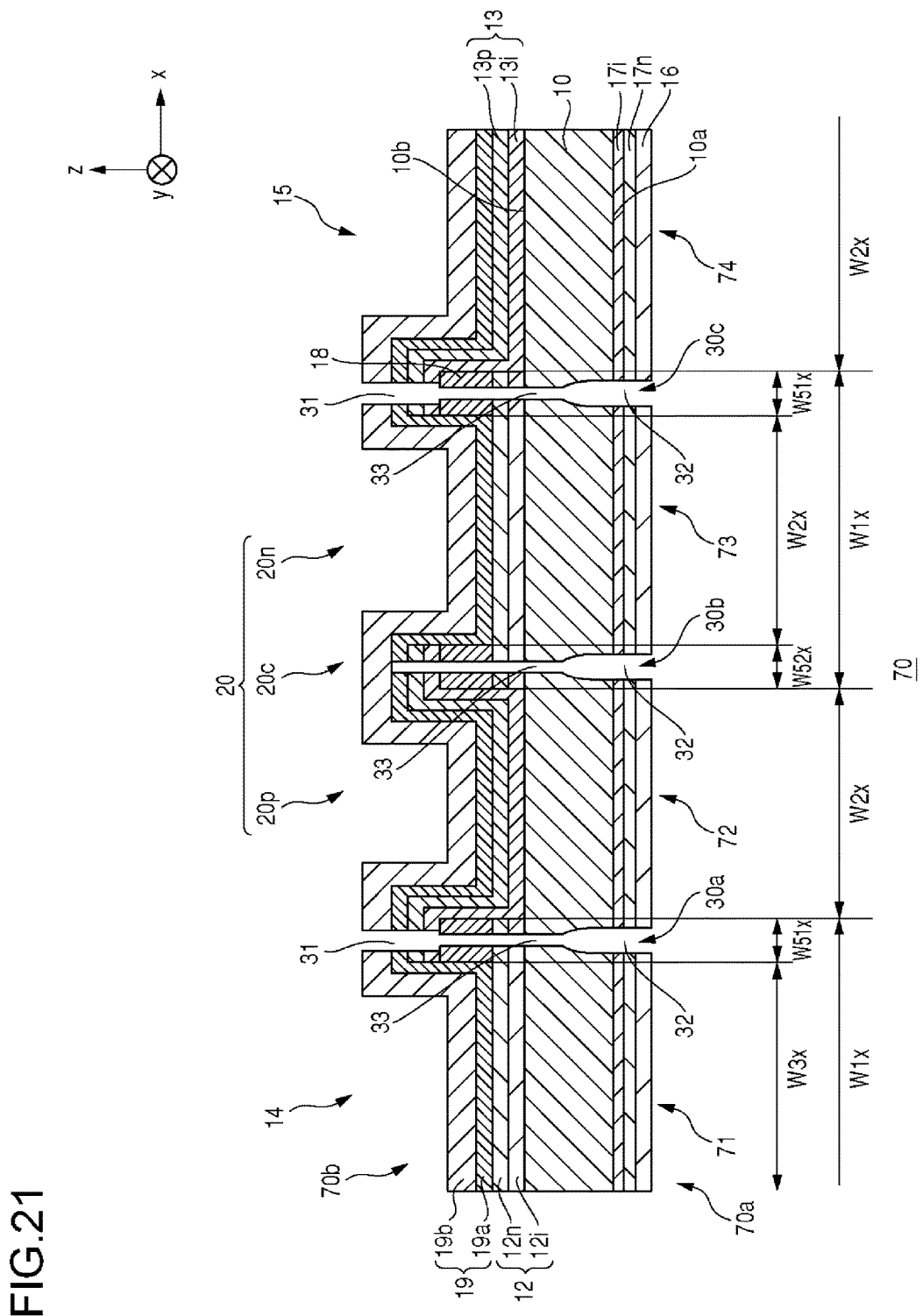
FIG. 21 is a sectional view of a structure of the solar cell according to the second embodiment.

FIG. 21 is a sectional view of a structure of the solar cell 70 according to the second embodiment and illustrates a B-B line cross section in FIG. 20. In FIG. 21, structures of the boundaries 30a to 30c which divide between the sub-cells 71 to 74 of the solar cell 70 are illustrated. The A-A line cross section in FIG. 20 has a structure illustrated in FIG. 3 similarly to the first embodiment.

Each of the boundaries 30a and 30c provided in the first isolation region W51x includes an isolation groove 31, a primary groove 32, and an insulation groove 33. The isolation groove 31 is provided on the back surface 70b and electrically insulates the adjacent electrodes by separating the electrode layer 19. The primary groove 32 is provided on the light receiving surface 70a and has a depth from the light receiving surface 70a to the middle of the semiconductor substrate 10. The primary groove 32 is provided to form the insulation groove 33. For example, the primary groove 32 is formed by irradiating the light receiving surface 70a with laser.

The insulation groove 33 passes through the semiconductor substrate 10 and prevents the movements of electrons or holes to be carries between adjacent sub-cells. Therefore, the insulation groove 33 functions as an insulation part which increases a resistance or insulates between the photoelectric converter of one sub-cell of the adjacent sub-cells and the photoelectric converter of the other sub-cell. By providing such an insulation part, the n-type region provided on one sub-cell is electrically isolated from the p-type region provided on the other sub-cell, and current collecting efficiency of the generated carrier can be improved. For example, the insulation groove 33 is formed by folding the semiconductor substrate 10 as having the primary groove 32 as a start point. At this time, the insulation groove 33 may pass through a first stacked body 12 and a second insulation layer 18 provided on a second principal surface 10b of the semiconductor substrate 10.

The primary groove 32 and the insulation groove 33 may be integrally formed by using other method. For example, the insulation groove 33 for passing through the semiconductor substrate 10 may be formed by performing a dicing treatment for cutting by a rotating blade from a side of the light receiving surface 70a and performing a sandblast treatment and an etching treatment to the light receiving surface 70a on which a mask is applied.

The boundary 30b provided in the second isolation region W52x includes the primary groove 32 and the insulation groove 33. On the other hand, the boundary 30b does not have the isolation groove 31. This is because the electrode layer 19 is not separated and a connection part 20c remains in the second isolation region W52x. Similarly to the first isolation region W51x, the insulation groove 33 in the second isolation region W52x can be formed by folding the semiconductor substrate 10. Only a semiconductor layer is cut and the insulation groove 33 is formed by folding the semiconductor substrate 10 after the electrode layer 19 has been formed. A metal layer remains connected without being cut. In the present embodiment, copper which is a material with high extensibility is used as the second conductive layer 19b. Therefore, the boundary 30b is formed so as to leave at least the second conductive layer 19b.

Next, a manufacturing method for the solar cell 70 according to the present embodiment will be described mainly with reference to FIGS. 22 to 24. The manufacturing process illustrated in FIGS. 5 to 17 as the first embodiment is common to the present embodiment. Therefore, a process after that will be mainly described below.

Figure 22:
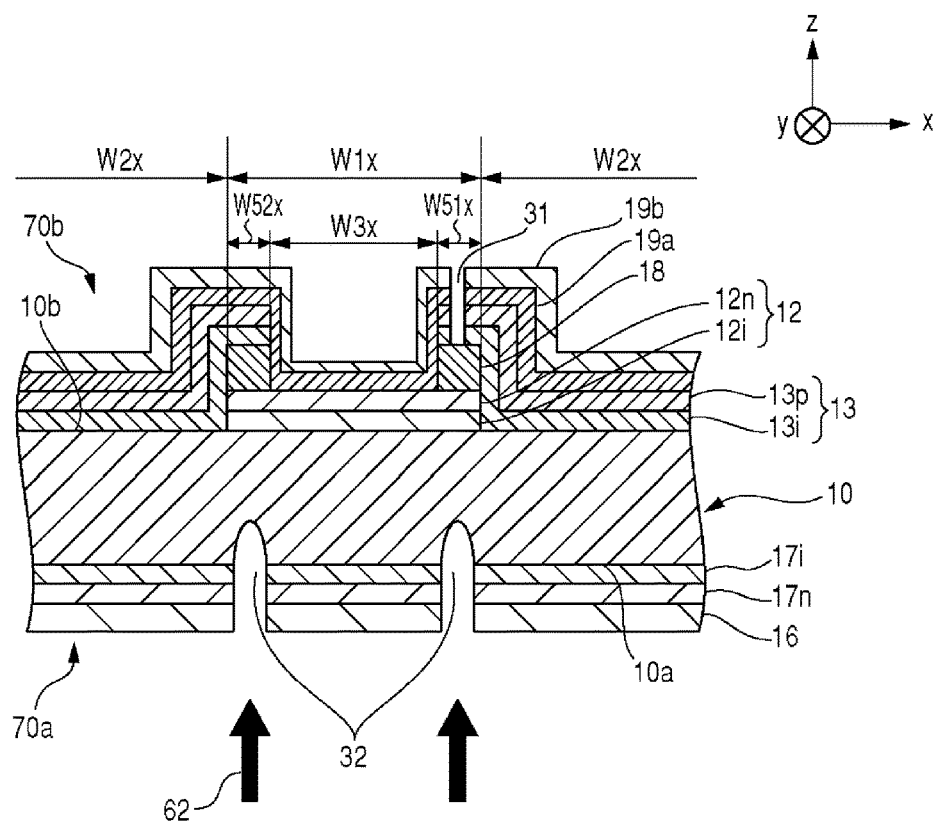
FIG. 22 is a schematic sectional view of a manufacturing process for the solar cell in an x direction.

Subsequently to the process illustrated in FIG. 17, as illustrated in FIG. 22, the primary groove 32 is formed by irradiating the light receiving surface 70a with laser 62. The laser 62 is irradiated to positions where the isolation regions W51x and W52x are provided. For example, solid-state laser such as YAG laser can be used as the laser 62. For example, the irradiation condition can include the wavelength of a second harmonic of equal to or more than 400 nm, the frequency of 1 to 50 kHz, the condensing diameter of 20 to 200 μm, and the output of 1 to 25 W. The primary groove 32 having the width almost the same as the condensing diameter of the laser can be formed by using this irradiation condition.

Figure 23:
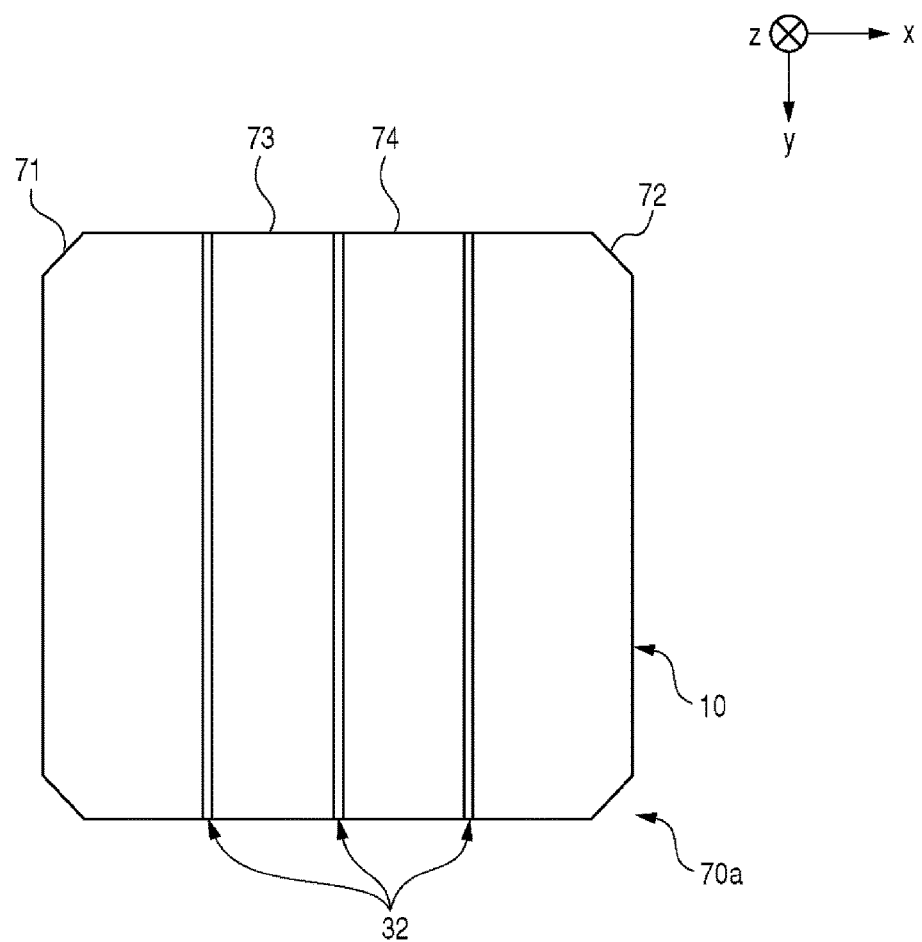
FIG. 23 is a schematic plan view of the manufacturing process for the solar cell.

FIG. 23 is a diagram of the light receiving surface 70a where the primary grooves 32 have been formed. The primary groove 32 is formed on the light receiving surface 70a so as to be extended in the y direction. According to this, the light receiving surface 70a is divided into regions respectively corresponding to the sub-cells 71 to 74.

Figure 24:
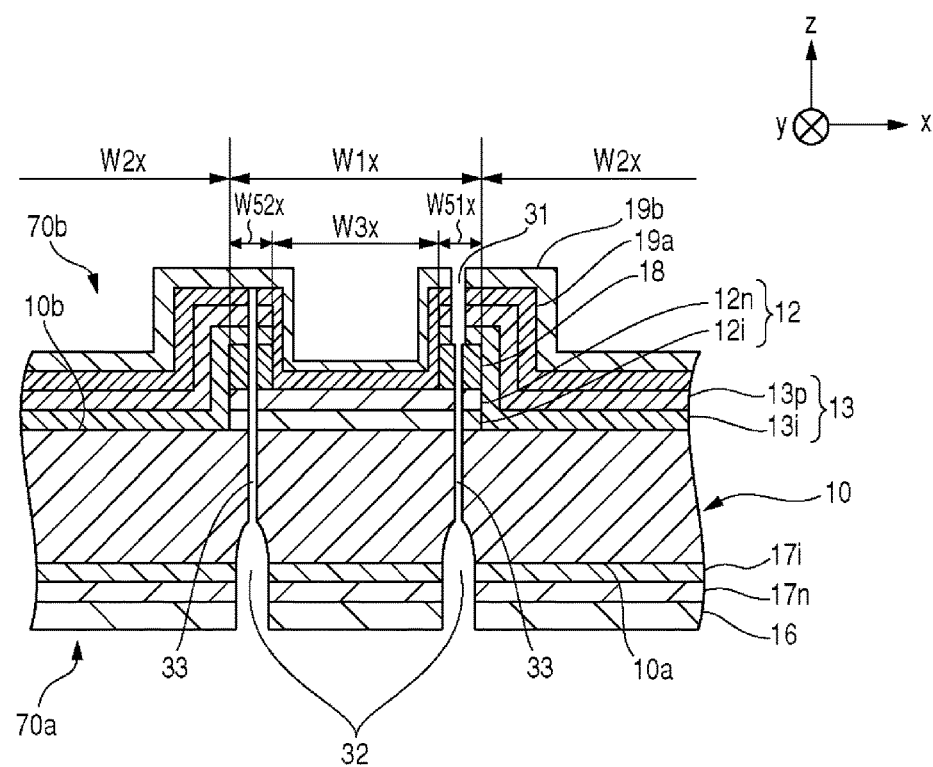
FIG. 24 is a schematic sectional view of the manufacturing process for the solar cell in the x direction.

Next, as illustrated in FIG. 24, the semiconductor substrate 10 is cut along the primary groove 32 and the insulation groove 33 is formed by folding the semiconductor substrate 10 along the primary groove 32. At this time, the semiconductor substrate 10, a first i-type layer 12i, a first conductivity type layer 12n, a second insulation layer 18 which are silicon semiconductor layers, and a first conductive layer 19a which is a transparent electrode layer are cut. As a result, the insulation groove 33 in the first isolation region W51x where the isolation groove 31 is formed passes through from the light receiving surface 70a to the back surface 70b, and the insulation groove 33 in the second isolation region W52x where the isolation groove 31 is not formed is trenched just before the second conductive layer 19b. According to this, the sub-cells can be insulated from each other in the isolation regions W51x and W52x, and the sub-electrode for connecting the adjacent sub-cells can be formed in the second isolation region W52x.

According to the above manufacturing process, the solar cell 70 illustrated in FIG. 21 can be formed.

Subsequently, an effect of the solar cell 70 according to the present embodiment will be described. In the present embodiment, a groove for dividing the photoelectric converter is formed in the boundary 30 between the sub-cells. This groove functions as an insulation part which increases the resistance or isolates between the photoelectric converter of one sub-cell and the photoelectric converter of other sub-cell. By providing such an insulation part, the n-type region provided on one sub-cell is electrically isolated from the p-type region provided on the other sub-cell, and current collecting efficiency of the generated carrier can be improved. According to this, the power generation efficiency of the solar cell 70 can be improved.

In the solar cell 70 of one aspect, the photoelectric converter may include the semiconductor substrate 10, the first conductivity type layer 12n which is provided on the back surface of the semiconductor substrate 10 and forms the n-type region, and the second conductivity type layer 13p which is provided on the back surface of the semiconductor substrate 10 and forms the p-type region. In the isolation region W5x, the insulation part for passing through at least the semiconductor substrate may be provided.

The insulation part may include the groove 33 for passing through at least the semiconductor substrate 10.

The electrode layer 19 includes the transparent electrode layer 19a which is provided on the first conductivity type layer 12n or the second conductivity type layer 13p and the metal electrode layer 19b which is provided on the transparent electrode layer 19a. The groove 33 may be trenched from the light receiving surface 70a to the transparent electrode layer 19a as remaining at least the metal electrode layer 19b.

Another aspect is a manufacturing method for the solar cell 70. In this method, the photoelectric converter is prepared which includes the light receiving surface 70a and the back surface 70b opposed to the light receiving surface 70a and in which the n-type regions and the p-type regions are alternately arranged in the first direction (y direction) on the back surface 70b. After the electrode layer 19 has been formed on the n-type region and the p-type region, the groove 33 extended in the first direction is formed in the light receiving surface 70a, and the photoelectric converter is divided into the plurality of sub-cells 71 to 74 along the groove 33.

The photoelectric converter may include the semiconductor substrate 10, the first conductivity type layer 12n which is provided on the back surface of the semiconductor substrate 10 and forms the n-type region, and the second conductivity type layer 13p which is provided on the back surface of the semiconductor substrate 10 and forms the p-type region. The groove 33 may be formed by cutting the photoelectric converter by applying an external force along the primary groove 32 after the primary groove 32 has been formed which is trenched to the middle of the semiconductor substrate 10 by irradiating the light receiving surface 70a with the laser.

Third Embodiment

A structure of a solar cell 70 according to the present embodiment will be described in detail with reference to FIGS. 25 to 27. In the second embodiment, the connection part 20c of the sub-electrode 20 is extended in the x direction in which the plurality of sub-cells 71 to 74 is arranged. However, in a third embodiment, the connection part 20c is extended in directions A and B oblique against the x direction. The third embodiment is different from the second embodiment in this point. Also, the sub-electrode 20 has a branch structure for branching into a connection part extended in the direction A and a connection part extended in the direction B. By providing the branch structure, the structure of the sub-electrode 20 is strong against a force applied in the x direction in which the sub-cell is divided. A difference from the second embodiment will be mainly described below.

Figure 25:
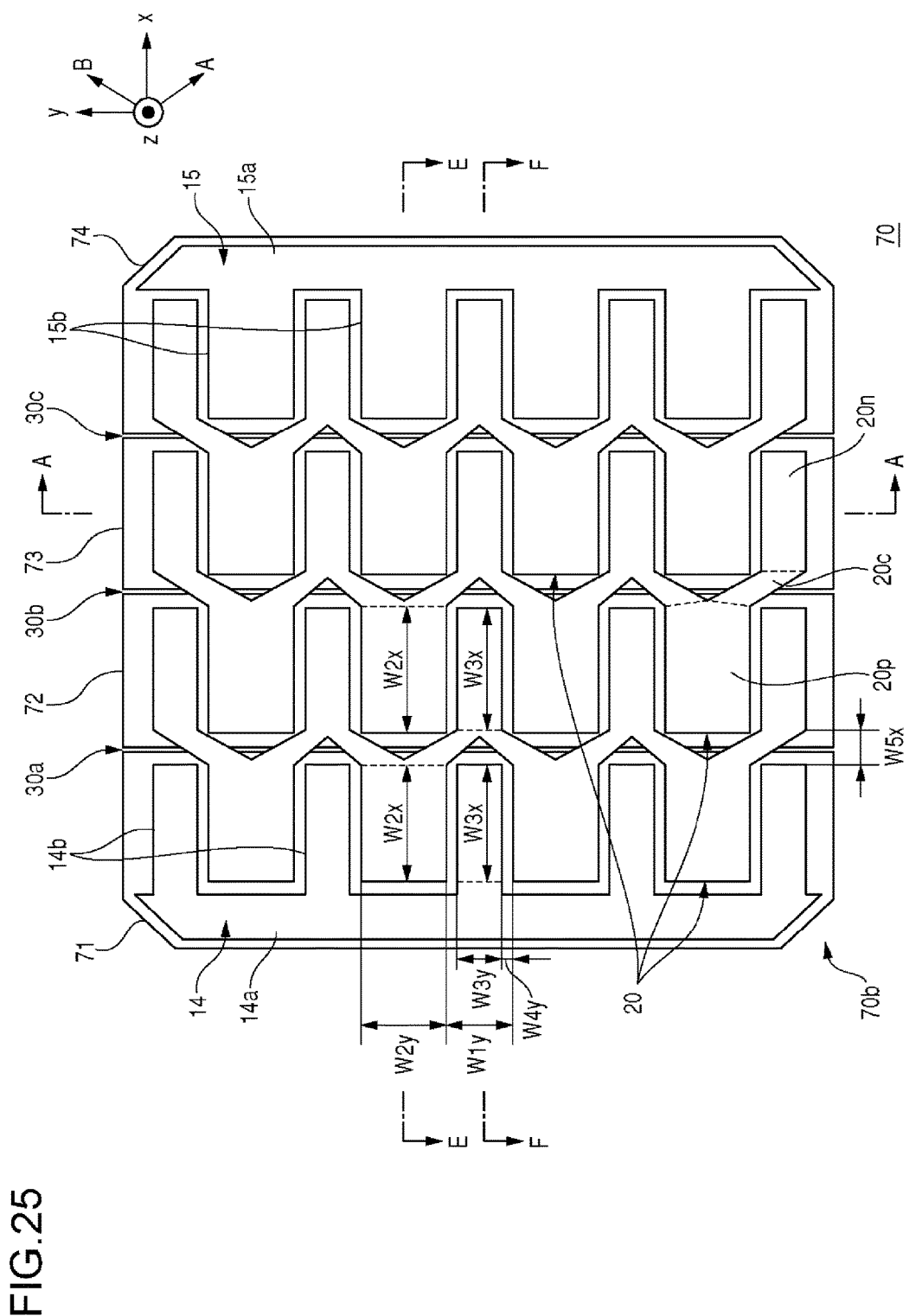
FIG. 25 is a plan view of a solar cell according to a third embodiment.

FIG. 25 is a plan view of the solar cell 70 according to the third embodiment. FIG. 26 is a sectional view of a structure of a p-type region of the solar cell and illustrates an E-E line cross section in FIG. 25. FIG. 27 is a sectional view of a structure of an n-type region of the solar cell and illustrates an F-F line cross section in FIG. 25. The A-A line cross section has the structure similar to the solar cell 70 according to the first embodiment illustrated in FIG. 3.

In the solar cell 70 according to the third embodiment, the n-type region and the p-type region are continuously provided in the x direction, in which the plurality of sub-cells 71 to 74 is arranged, as sandwiching an isolation region W5x therebetween. On the cross section along the E-E line, as illustrated in FIG. 26, a second region W2x to be the p-type region and the isolation region W5x where the second insulation layer 18 is provided are alternately arranged in the x direction. Similarly, on the cross section along the F-F line, as illustrated in FIG. 27, third regions W3x to be the n-type regions and the isolation regions W5x where the second insulation layers 18 are provided are alternately arranged in the x direction. Therefore, in the second embodiment, the n-type region provided in one sub-cell of the adjacent sub-cells and the p-type region provided in the other sub-cell are arranged with deviation in the y direction. According to this, the connection part 20c which connects an n-side part 20n provided on the n-type region to a p-side part 20p provided on the p-type region is provided as being extended in the directions A and B oblique against the x direction, not in the x direction.

Figure 28:
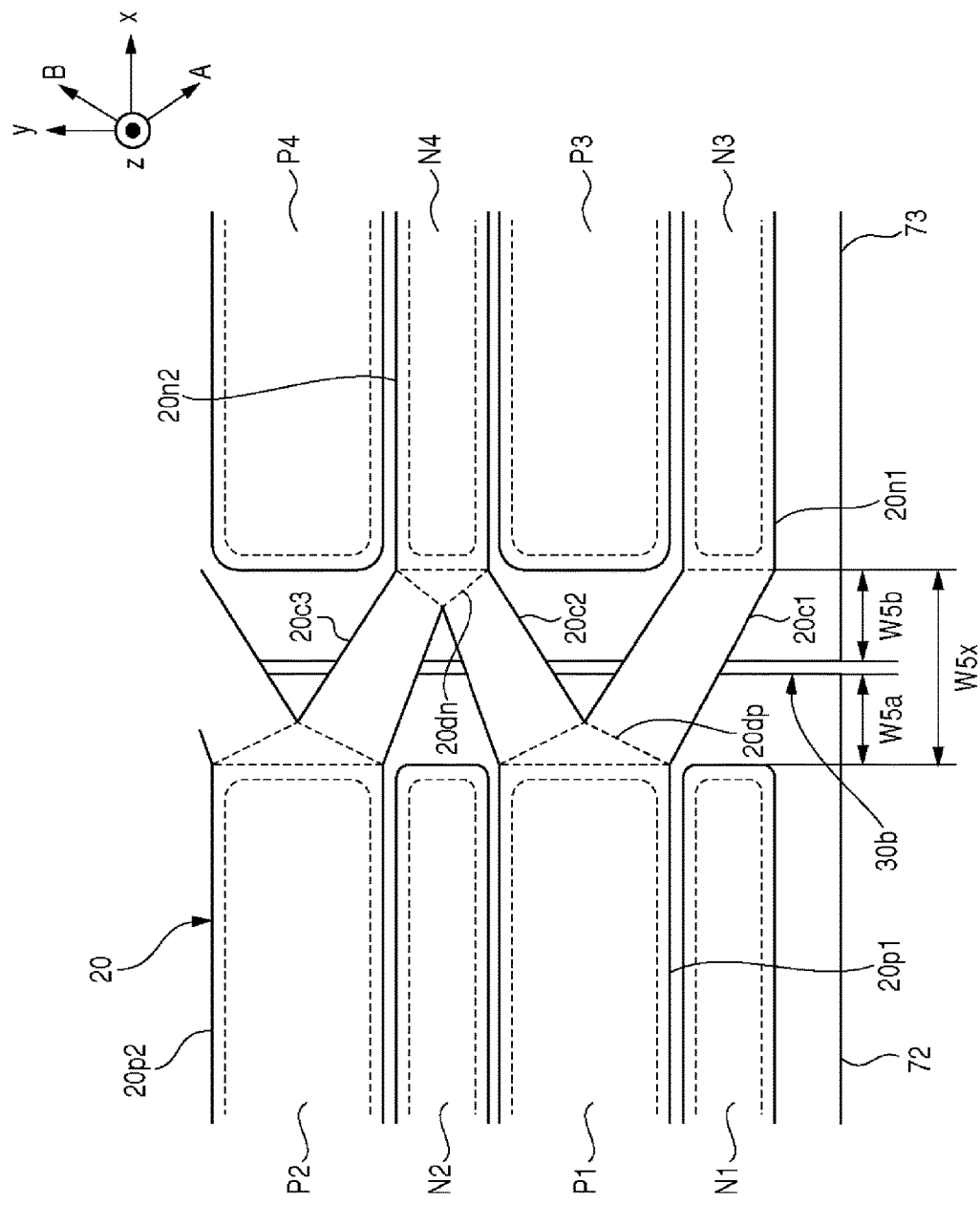
FIG. 28 is a plan view of a structure of a sub-electrode according to the third embodiment.

FIG. 28 is a plan view of a structure of the sub-electrode 20 according to the third embodiment. In FIG. 28, the sub-electrode 20 for connecting between a second sub-cell 72 and a third sub-cell 73 is illustrated.

For convenience of description, the n-type regions and the p-type regions which are alternately arranged in +y direction in the second sub-cell 72 are respectively referred to as a first n-type region N1, a first p-type region P1, a second n-type region N2, and a second p-type region P2 in order from the bottom on a plane of paper. Similarly, the n-type regions and the p-type regions which are alternately arranged in +y direction in the third sub-cell 73 are respectively referred to as a third n-type region N3, a third p-type region P3, a fourth n-type region N4, and a fourth p-type region P4 in order from the bottom.

The sub-electrode 20 includes a plurality of p-side parts 20p1 and 20p2, a plurality of n-side parts 20n1 and 20n2, a plurality of connection parts 20c1, 20c2, and 20c3, a p-side branch part 20dp, and an n-side branch part 20dn.

The first p-side part 20p1 is provided on the first p-type region P1 of the second sub-cell 72, and the second p-side part 20p2 is provided on the second p-type region P2 of the second sub-cell 72. The first n-side part 20n1 is provided on the third n-type region N3 of the third sub-cell 73, and the second n-side part 20n2 is provided on the fourth n-type region N4 of the third sub-cell 73.

The first connection part 20c1 connects the first p-side part 20p1 of the second sub-cell 72 to the first n-side part 20n1 of the third sub-cell 73. Therefore, the first connection part 20c1 is extended in the direction A (a right obliquely downward direction on a plane of paper) between +x direction and −y direction. The second connection part 20c2 connects the first p-side part 20p1 of the second sub-cell 72 to the second n-side part 20n2 of the third sub-cell 73. Therefore, the second connection part 20c2 is extended in the direction B (a right obliquely upward direction on a plane of paper) between +x direction and +y direction. The third connection part 20c3 connects the second p-side part 20p2 of the second sub-cell 72 to the second n-side part 20n2 of the third sub-cell 73. Therefore, the third connection part 20c3 is extended in the direction A between +x direction and −y direction. In this way, the connection parts 20c1 to 20c3 are extended in the oblique directions A and B intersecting with both the x direction and the y direction in the isolation region W5x.

The p-side branch part 20dp is a branch structure which is branched from the first p-side part 20p1 into the first connection part 20c1 and the second connection part 20c2. The p-side branch part 20dp connects the first p-type region P1 of the second sub-cell 72 to both the third n-type region N3 and the fourth n-type region N4 which are positioned on both adjacent sides of the third p-type region P3 of the third sub-cell 73 opposed to the first p-type region P1.

The p-side branch part 20dp is arranged in a region W5a close to the second sub-cell 72 to be a branch source not in a region W5b close to the third sub-cell 73 to be a branch destination. According to this, the lengths of the first connection part 20c1 and the second connection part 20c2 can be increased. By having the longer length of the branched connection part, a tension applied in the x direction can be effectively dispersed in the y direction, and an effect of tension relaxation caused by the branch structure can be improved.

The n-side branch part 20dn is a branch structure which is branched from the second n-side part 20n2 into the second connection part 20c2 and the third connection part 20c3. The n-side branch part 20dn connects the fourth n-type region N4 of the third sub-cell 73 to both the first p-type region P1 and the second p-type region P2 which are positioned on both adjacent sides of the second n-type region N2 of the second sub-cell 72 opposed to the fourth n-type region N4.

The n-side branch part 20dn is arranged in the region W5b close to the third sub-cell 73 which is the branch source not in the region W5a close to the second sub-cell 72 to be the branch destination. According to this, the lengths of the second connection part 20c2 and the third connection part 20c3 can be increased in the isolation region W5x. By having the longer length of the branched connection part, a tension applied in the x direction can be effectively dispersed in the y direction, and an effect of tension relaxation caused by the branch structure can be improved.

In the present embodiment, as illustrated in FIG. 25, the sub-electrode 20 is formed in a zigzag shape by alternately arranging the p-side branch parts and the n-side branches. According to this, the effect of the tension relaxation applied to the sub-electrode 20 can be further improved.

Next, a manufacturing method for the solar cell 70 according to the present embodiment will be described mainly with reference to FIGS. 29 to 39. In the present embodiment, a structure of a cross section corresponding to the E-E line where the p-type region is formed is different from a structure of a cross section corresponding to the F-F line where the n-type region is formed. Therefore, the manufacturing method for the solar cell 70 will be described as indicating each cross section.

First, the semiconductor substrate 10 illustrated in FIG. 5 is prepared, and an i-type amorphous semiconductor layer to be the third i-type layer 17i, an n-type amorphous semiconductor layer to be the third conductivity type layer 17n, and an insulation layer 23 to be the second insulation layer 18 are formed on a first principal surface 10a of the semiconductor substrate 10. Also, an i-type amorphous semiconductor layer 21, an n-type amorphous semiconductor layer 22, and a first insulation layer 16 are formed on a second principal surface 10b of the semiconductor substrate 10.

Figure 29:
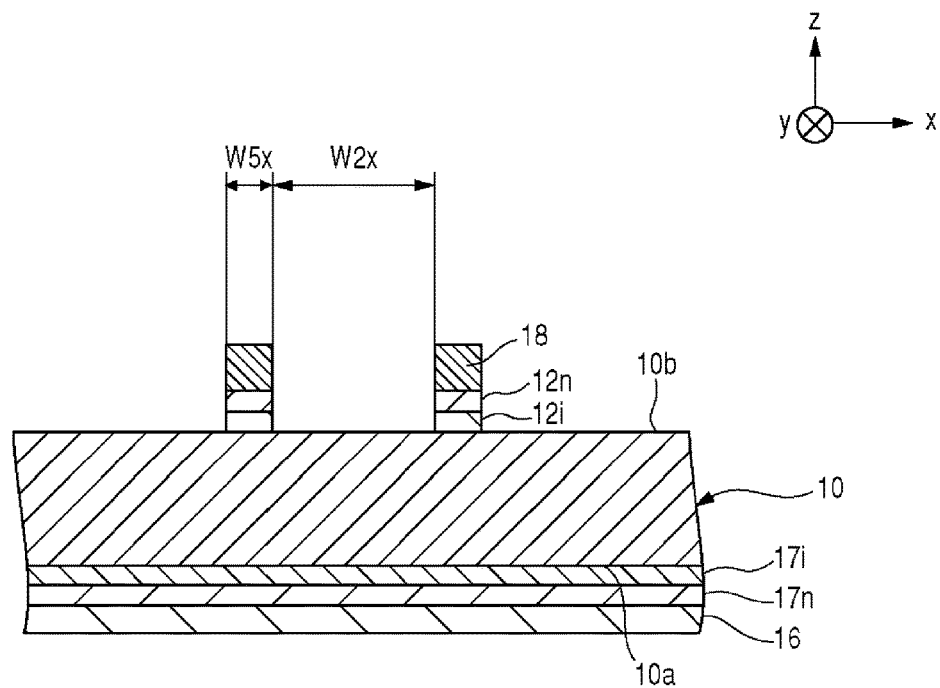
FIG. 29 is a schematic sectional view of a manufacturing process for a p-type region of a solar cell.
Figure 30:
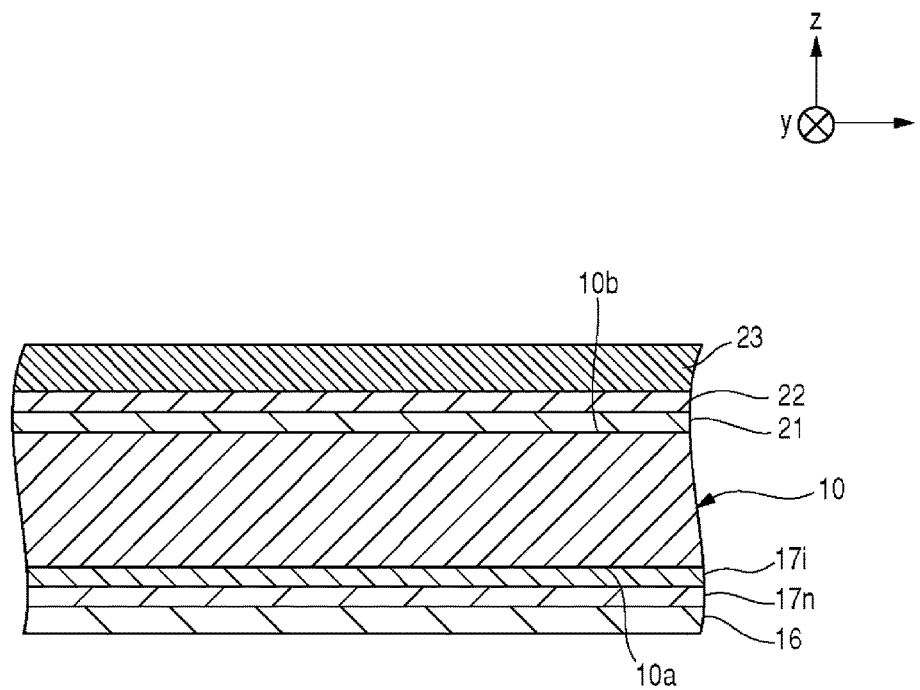
FIG. 30 is a schematic sectional view of a manufacturing process for an n-type region of the solar cell.

Next, as illustrated in FIG. 29, etching is performed to a partial region of the i-type amorphous semiconductor layer 21, the n-type amorphous semiconductor layer 22, and the insulation layer 23. FIG. 29 corresponds to an E-E line cross section where the p-type region is formed. According to this, a second region W2x where the insulation layer 23 is removed by the etching and an isolation region W5x where the insulation layer 23 remains and becomes the second insulation layer 18 are formed. On the other hand, as illustrated in FIG. 30, at a position where the n-type region is formed, the etching treatment is not performed to the i-type amorphous semiconductor layer 21, the n-type amorphous semiconductor layer 22, and the insulation layer 23. FIG. 30 is a diagram corresponding to the F-F line cross section where the n-type region is formed. At this time, FIG. 6 is a diagram corresponding to the A-A line cross section in FIG. 25.

Figure 31:
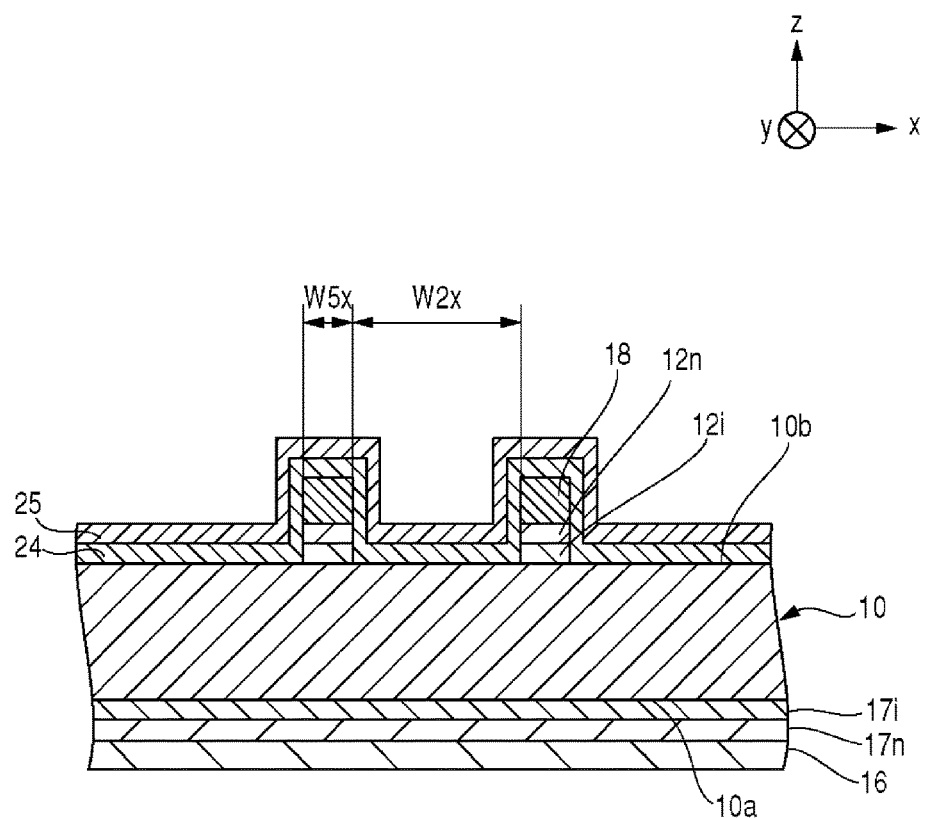
FIG. 31 is a schematic sectional view of the manufacturing process for the p-type region of the solar cell.
Figure 32:
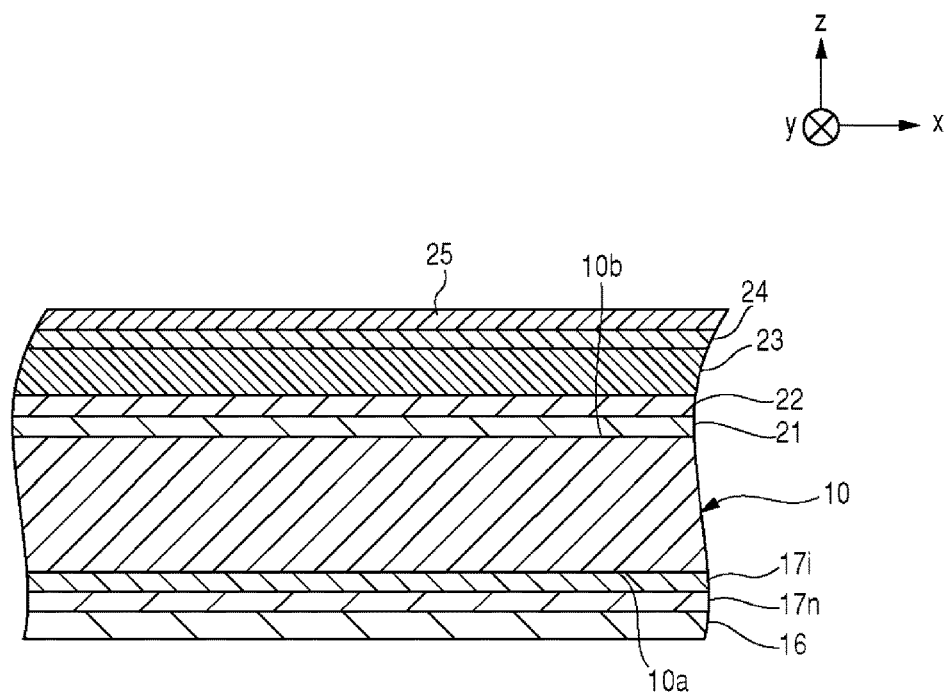
FIG. 32 is a schematic sectional view of the manufacturing process for the n-type region of the solar cell.

Next, as illustrated in FIGS. 31 and 32, the i-type amorphous semiconductor layer 24 is formed so as to cover the second principal surface 10b, and the p-type amorphous semiconductor layer 25 is formed on the i-type amorphous semiconductor layer 24. In FIG. 31, a state is illustrated in which the i-type amorphous semiconductor layer 24 and the p-type amorphous semiconductor layer 25 have been formed on the second principal surface 10b illustrated in FIG. 29. In FIG. 32, a state is illustrated in which the i-type amorphous semiconductor layer 24 and the p-type amorphous semiconductor layer 25 have been formed on the insulation layer 23 illustrated in FIG. 30. At this time, FIG. 8 is a diagram corresponding to the A-A line cross section in FIG. 25.

Figure 33:
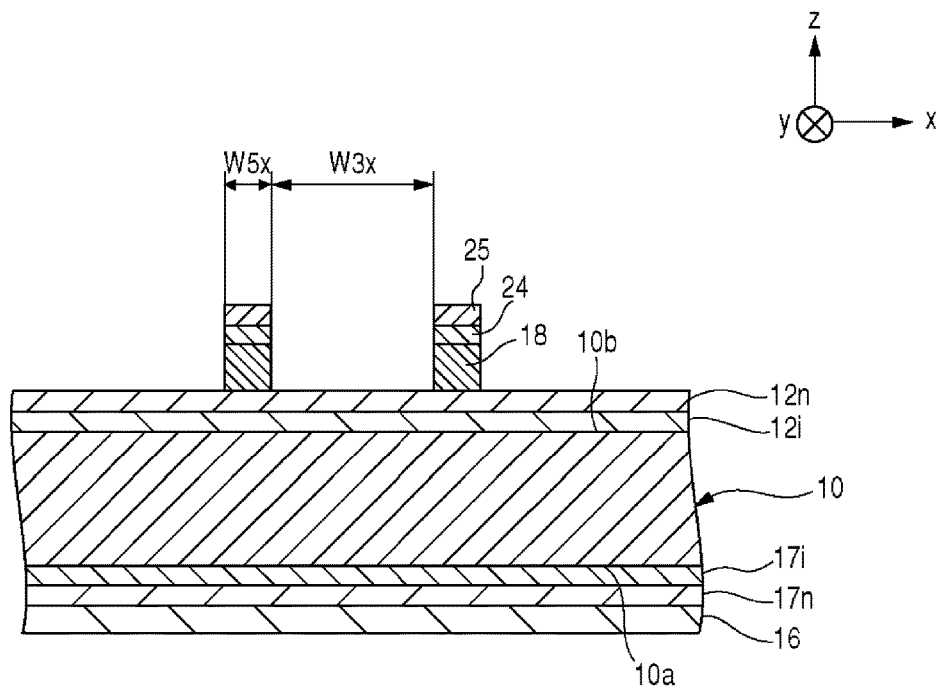
FIG. 33 is a schematic sectional view of the manufacturing process for the n-type region of the solar cell.

Next, as illustrated in FIG. 33, the etching is performed to the insulation layer 23, the i-type amorphous semiconductor layer 24, and the p-type amorphous semiconductor layer 25. According to this, the third region W3x where the insulation layer 23 is removed and the isolation region W5x where the insulation layer 23 remains and becomes the second insulation layer 18 are formed. On the other hand, at a position where the p-type region is formed illustrated in FIG. 31, the etching treatment is not performed to the i-type amorphous semiconductor layer 24 and the p-type amorphous semiconductor layer 25. At this time, FIG. 12 is a diagram corresponding to the A-A line cross section in FIG. 25.

Figure 34:
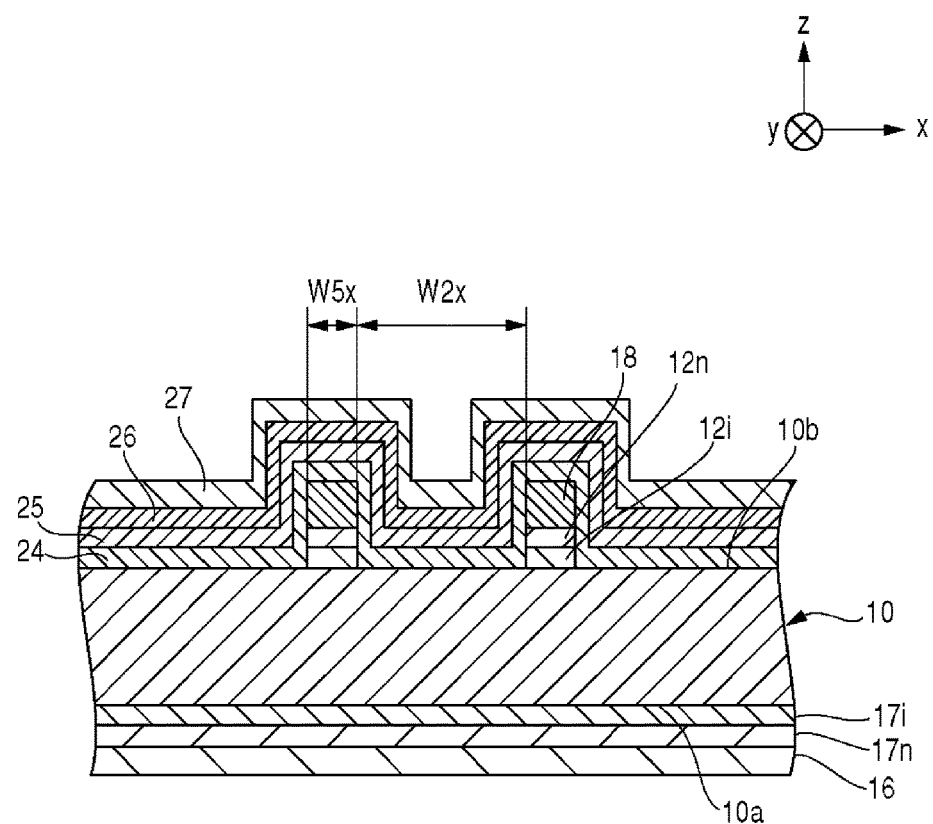
FIG. 34 is a schematic sectional view of the manufacturing process for the p-type region of the solar cell.
Figure 35:
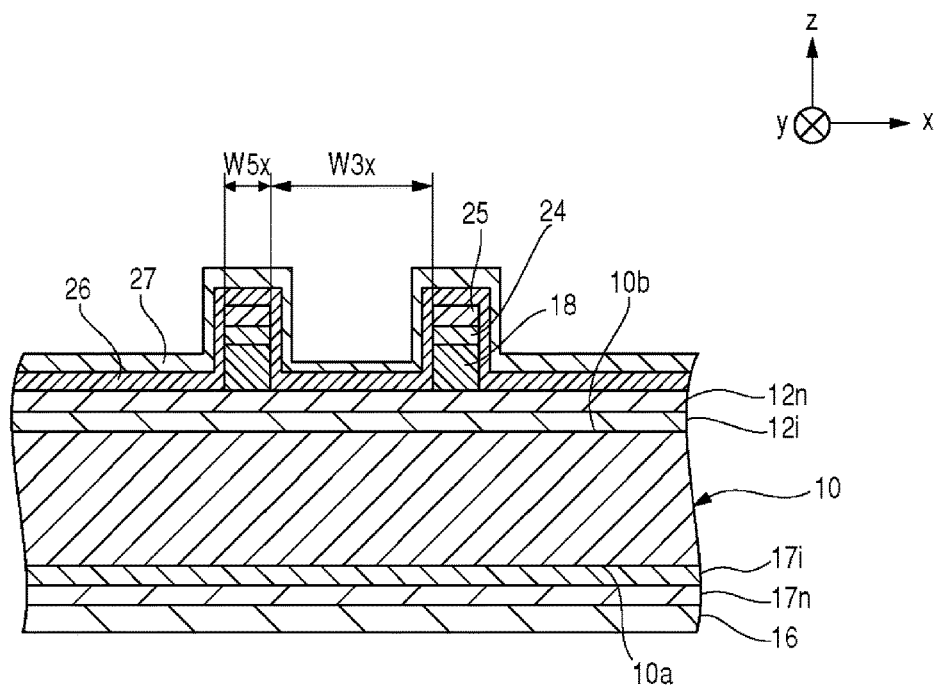
FIG. 35 is a schematic sectional view of the manufacturing process for the n-type region of the solar cell.

Next, as illustrated in FIGS. 34 and 35, conductive layers 26 and 27 are formed on the first conductivity type layer 12n and the second conductivity type layer 13p. At this time, FIG. 14 is a diagram corresponding to the A-A line cross section in FIG. 25.

Figure 36:
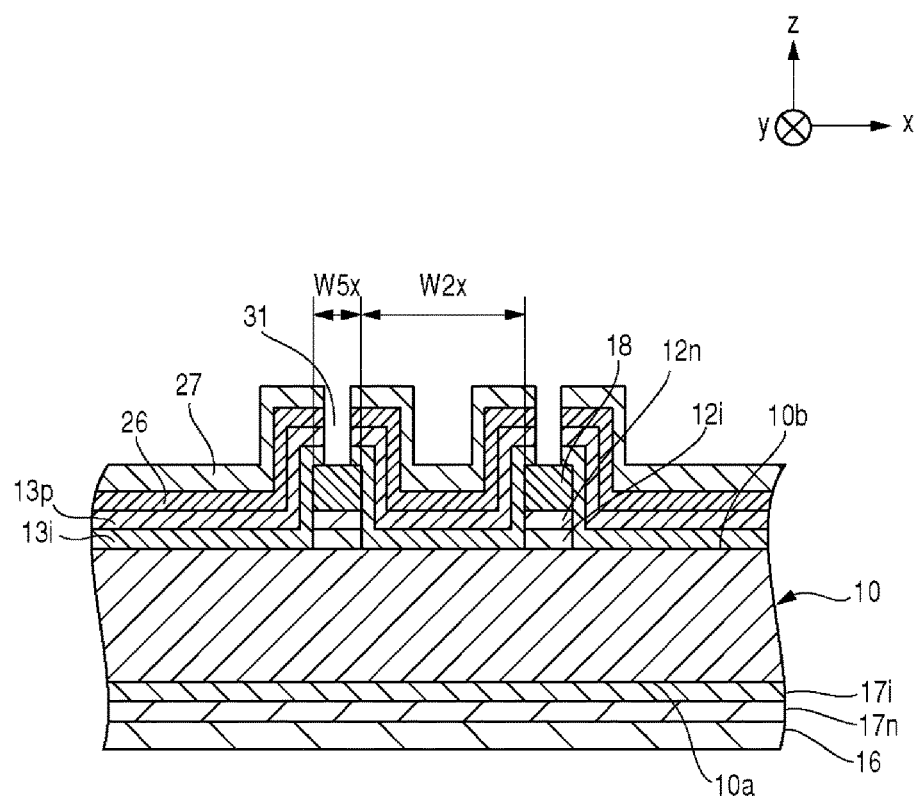
FIG. 36 is a schematic sectional view of the manufacturing process for the p-type region of the solar cell.
Figure 37:
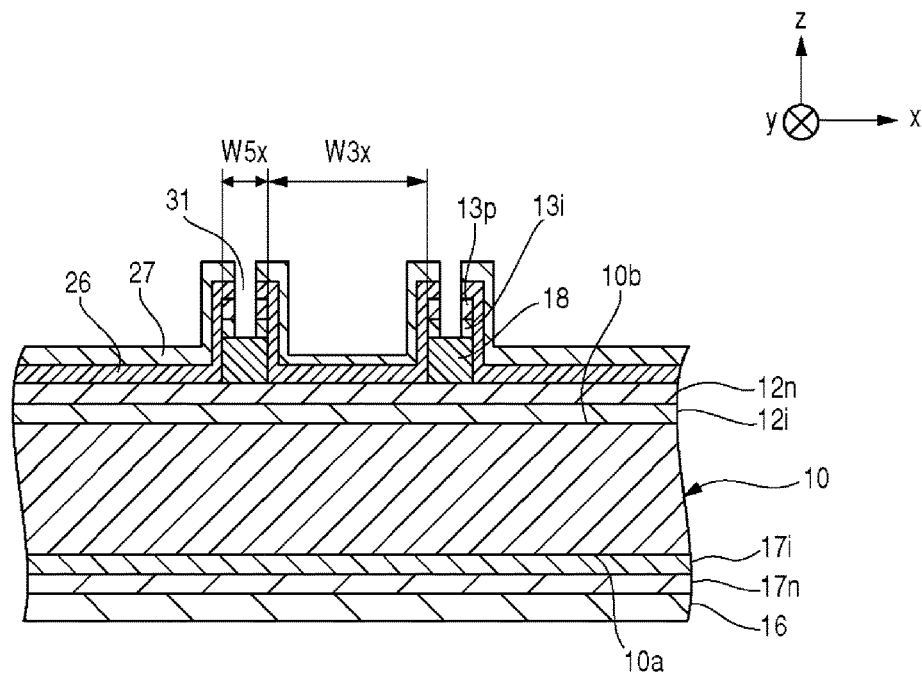
FIG. 37 is a schematic sectional view of the manufacturing process for the n-type region of the solar cell.

Next, as illustrated in FIGS. 36 and 37, an isolation groove 31 is formed in the isolation region W5x. The conductive layers 26 and 27 are separated into the n-side electrode 14, the p-side electrode 15, and the sub-electrode 20 illustrated in FIG. 25 by forming the isolation groove 31. At this time, FIG. 16 is a diagram corresponding to the A-A line cross section in FIG. 25.

Figure 38:
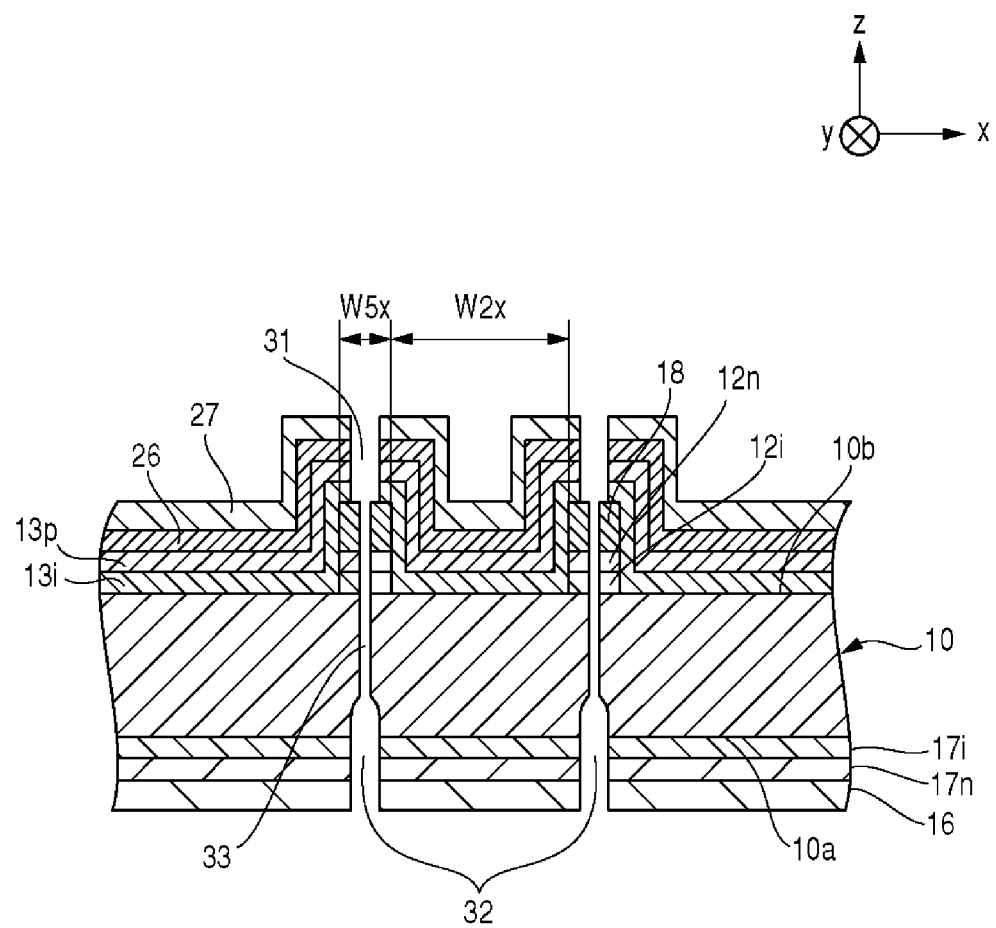
FIG. 38 is a schematic sectional view of the manufacturing process for the p-type region of the solar cell.
Figure 39:
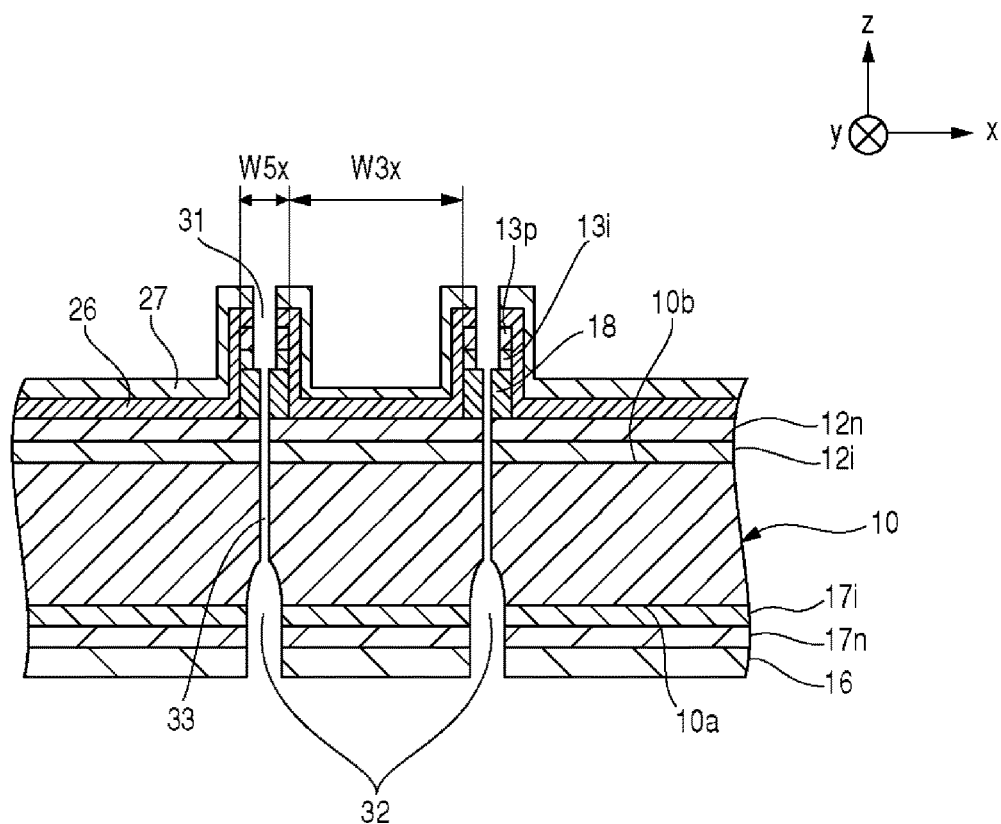
FIG. 39 is a schematic sectional view of the manufacturing process for the n-type region of the solar cell.

Next, as illustrated in FIGS. 38 and 39, a primary groove 32 is formed by irradiating the light receiving surface 70a with laser. After that, the semiconductor substrate 10 is cut and the insulation groove 33 is formed by folding the semiconductor substrate 10 along the primary groove 32. According to this, the solar cell 70 is divided into the plurality of sub-cells while sandwiching the isolation region W5x therebetween.

Figure 26:
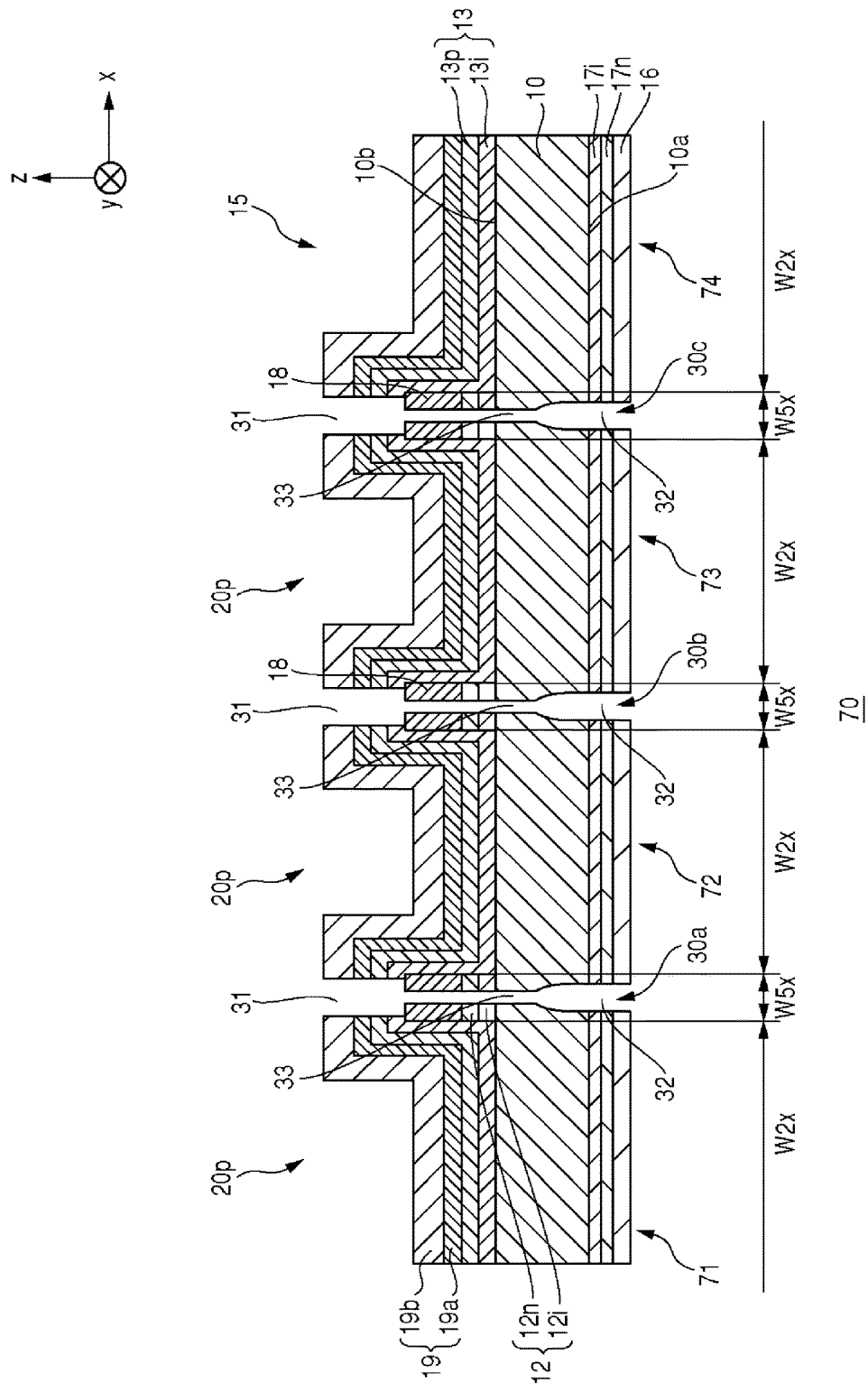
FIG. 26 is a sectional view of a structure of a p-type region of the solar cell according to the third embodiment.
Figure 27:
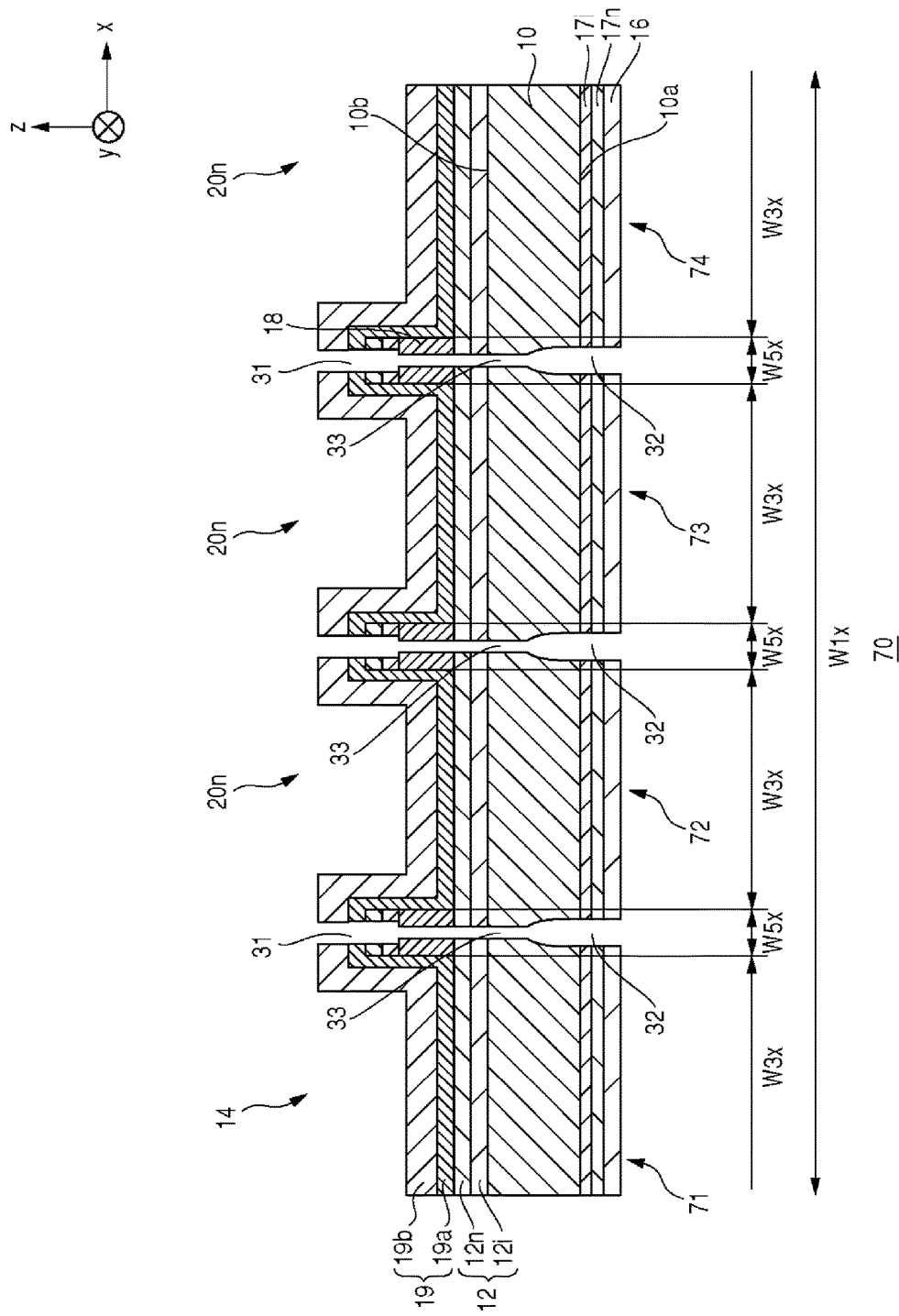
FIG. 27 is a sectional view of a structure of an n-type region of the solar cell according to the third embodiment.

According to the manufacturing process, the solar cell 70 illustrated in FIGS. 25 and 26 can be formed.

Subsequently, an effect of the solar cell 70 according to the present embodiment will be described.

Similarly to the above embodiments, in the present embodiment, since the solar cell 70 is divided into the plurality of sub-cells 71 to 74, the lengths of finger electrodes 14b and 15b extended in the x direction can be reduced. According to this, compared with a case where the finger electrodes 14b and 15b are formed to be thin and long, the resistance values of the finger electrodes 14b and 15b is lowered, and the current collecting efficiency can be improved.

In the present embodiment, the sub-electrode 20 for connecting the adjacent sub-cells has a branch structure, and the sub-electrode 20 is formed in a zigzag shape over the isolation region W5x. Therefore, even when the solar cell 70 is divided into the plurality of sub-cells and the force is applied in the x direction, the force applied to the sub-electrode 20 for connecting the sub-cells can be dispersed in an oblique direction. Therefore, even when the manufacturing method for providing the insulation groove 33 after the electrode layers have been collectively formed is employed, the sub-electrode 20 is hard to be cut. Therefore, the sub-electrode 20 having the branch structure can prevent the reduction in yield at the time of manufacturing the solar cell 70.

In the present embodiment, the sub-electrode 20 connects the regions with the same conductivity type in parallel from among the plurality of n-type regions or the p-type regions alternately arranged in the y direction in a single sub-cell. According to this, an electrode area of the connection part 20c provided on the isolation region W5x is formed to be larger than that in a case where the n-type region and the p-type region are connected to each other one by one between the adjacent sub-cells, and a resistance of the sub-electrode 20 can be reduced.

According to this, current collecting efficiency by the sub-electrode 20 is improved, and the power generation efficiency of the solar cell 70 can be improved.

A solar cell 70 of one aspect includes a photoelectric converter in which n-type regions and p-type regions are alternately arranged in a first direction (y direction) on a principal surface and an electrode layer 19 provided on the principal surface. The photoelectric converter includes a plurality of sub-cells 71 to 74 arranged in a second direction (x direction) intersecting with the first direction and an isolation region W5x provided on a boundary between adjacent sub-cells. An electrode layer 19 includes an n-side electrode 14 provided on the n-type region in the sub-cell 71 at the end of the plurality of sub-cells 71 to 74, a p-side electrode 15 provided on the p-type region in the sub-cell 74 at the other end, and a sub-electrode 20 provided over the two adjacent sub-cells. The sub-electrode 20 includes an n-side part 20n provided on the n-type region in one sub-cell from among adjacent two sub-cells, a p-side part 20p provided on the p-type region in the other sub-cell, and a connection part 20c between the n-side part 20n and the p-side part 20p. The connection part 20c is extended in a direction intersecting with a first direction and a second direction in an isolation region W5x.

The sub-electrode 20 may include an n-side branch part 20dn which branches into a first connection part 20c2 which is extended from an n-type region N4 in one sub-cell 73 to a first p-type region P1 in the other sub-cell 72 and a second connection part 20c3 which is extended from the n-type region N4 in one sub-cell 73 to a second p-type region P2 adjacent to the first p-type region P1 in the other sub-cell 72.

The n-side branch part 20dn may be provided at a position closer to one sub-cell 73 than the other sub-cell 72.

The sub-electrode 20 may include a p-side branch part 20dp which branches into a third connection part 20c1 which is extended from the p-type region P1 in the other sub-cell 72 to a first n-type region N3 in one sub-cell 73 and a fourth connection part 20c2 which is extended from the p-type region P1 from the other sub-cell 72 to a second n-type region N4 adjacent to the first n-type region N3 in one sub-cell 73.

The p-side branch part 20dp may be provided at a position closer to the other sub-cell 72 than one sub-cell 73.

Fourth Embodiment

A structure of a solar cell module 100 according to the present embodiment will be described in detail with reference to FIGS. 40 and 41.

Figure 40:
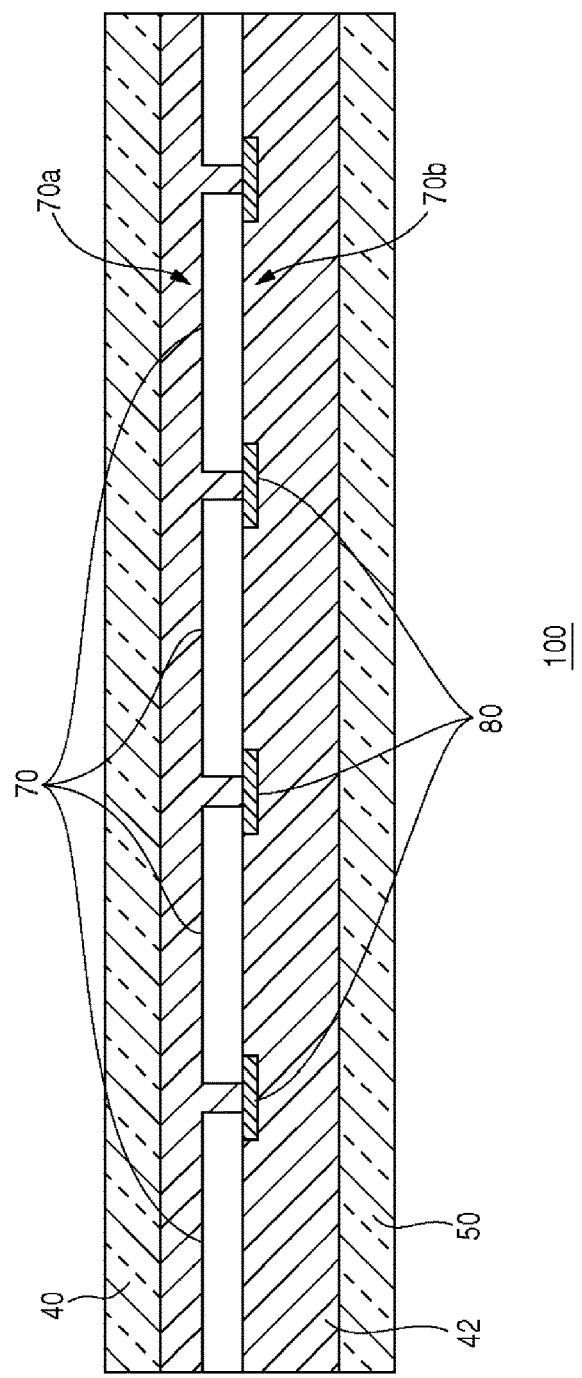
FIG. 40 is a sectional view of a structure of a solar cell module according to a fourth embodiment.

FIG. 40 is a sectional view of the structure of the solar cell module 100 according to a fourth embodiment.

In the solar cell module 100, after the plurality of solar cells 70 illustrated in the above embodiments has been connected with a wiring material 80, it is sealed by a protection substrate 40, a sealing layer 42, and aback sheet 50. The solar cell module 100 includes the plurality of solar cells 70, the wiring material 80, the protection substrate 40, the sealing layer 42, and the back sheet 50.

The protection substrate 40 and the back sheet 50 are members which protect the solar cell 70 from external environment. Light in a wavelength band absorbed by the solar cell 70 to generate power passes through the protection substrate 40 provided on a side of a light receiving surface 70a. For example, the protection substrate 40 is a glass substrate. For example, the back sheet 50 is formed of a resin sheet such as polyethylene terephthalate (PET) and a glass substrate same as the protection substrate 40.

The sealing layer 42 is formed of a resin material such as ethylene-vinyl acetate copolymer (EVA) and polyvinyl butyral (PVB). According to this, entry of water to a power generation layer of the solar cell module 100 is prevented, and the strength of the whole solar cell module 100 is improved.

Figure 41:
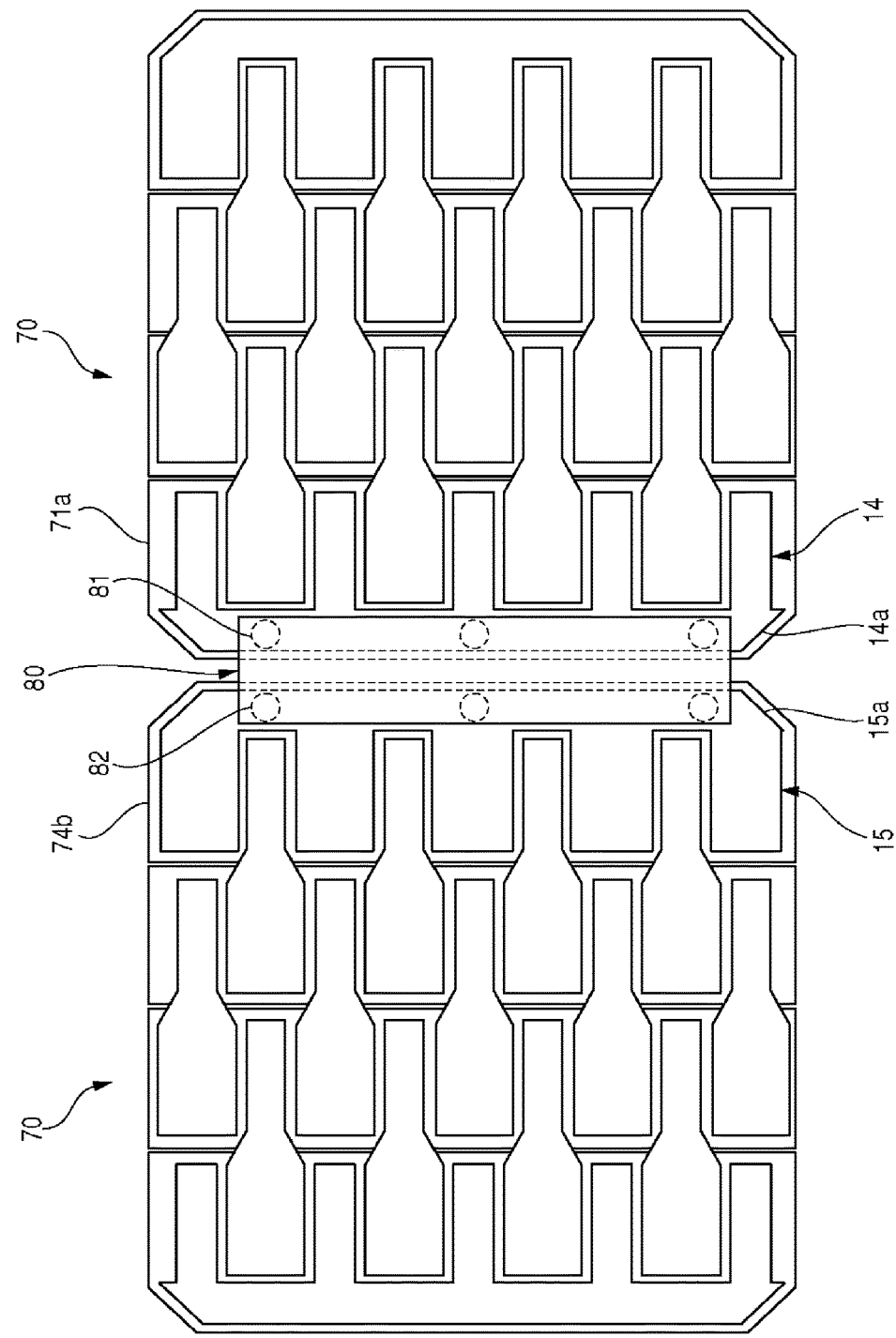
FIG. 41 is a plan view of a structure of a wiring material according to the fourth embodiment.

FIG. 41 is a plan view of a structure of the wiring material 80 according to the fourth embodiment.

The wiring material 80 connects an n-side electrode 14 of one solar cell 70 of adjacent solar cells 70 to a p-side electrode 15 of the other solar cell 70. The wiring material 80 includes a first contact 81 and a second contact 82. The first contact 81 is connected to a bus bar electrode 14a provided on a first sub-cell 71a of one solar cell 70. The second contact 82 is connected to a bus bar electrode 15a provided on a fourth sub-cell 74b of the other solar cell 70. According to this, the solar cells 70 are connected to each other in series with the wiring material 80. The wiring material 80 may connect the solar cells 70 to each other in parallel.

In the solar cell module 100 according to the present embodiment, by connecting the solar cells 70 in series, an output voltage can be increased compared with a case where a single solar cell 70 is used. Also, since the plurality of sub-cells 71 to 74 is connected in series in the solar cell 70 according to the present embodiment, the output voltage per solar cell 70 is higher than that of the solar cell 170 according to the comparative example. Therefore, even when the number of the solar cells 70 to be used is reduced, the solar cell module 100 can increase the output voltage. According to this, a compact solar cell module 100 with a high output voltage can be provided.

Another aspect is a solar cell module 100. The solar cell module 100 includes the plurality of solar cells 70 and the wiring material 80 for connecting the solar cells 70 to each other. The solar cell 70 includes a photoelectric converter which includes a light receiving surface 70a and a back surface 70b opposed to the light receiving surface 70a and on which n-type regions and p-type regions are alternately arranged in a first direction (y direction) on the back surface 70b and an electrode layer 19 which is provided on the n-type region and the p-type region. The photoelectric converter includes a plurality of sub-cells 71 to 74 arranged in a second direction (x direction) intersecting with the first direction and an isolation region W5x provided on a boundary between adjacent sub-cells. An electrode layer 19 includes an n-side electrode 14 provided on the n-type region in the sub-cell 71 at the end of the plurality of sub-cells 71 to 74, a p-side electrode 15 provided on the p-type region in the sub-cell 74 at the other end, and a sub-electrode 20 provided over the two adjacent sub-cells. The sub-electrode 20 connects the n-type region provided on one sub-cell from among the two adjacent sub-cells to the p-type region provided on the other sub-cell. The wiring material 80 connects the n-side electrode 14 of one solar cell 70 of the adjacent solar cells 70 to the p-side electrode 15 of the other solar cell 70.

A solar cell module 100 of still another aspect includes the plurality of solar cell 70 and the wiring material 80 for connecting the solar cells 70 to each other. The solar cell 70 includes the photoelectric converter in which the n-type regions and the p-type regions are alternately arranged in the first direction (y direction) on the principal surface and the electrode layer 19 which is provided on the principal surface. The photoelectric converter includes a plurality of sub-cells 71 to 74 arranged in a second direction (x direction) intersecting with the first direction and an isolation region W5x provided on a boundary between adjacent sub-cells. An electrode layer 19 includes an n-side electrode 14 provided on the n-type region in the sub-cell 71 at the end of the plurality of sub-cells 71 to 74, a p-side electrode 15 provided on the p-type region in the sub-cell 74 at the other end, and a sub-electrode 20 provided over the two adjacent sub-cells. The sub-electrode 20 includes an n-side part 20n provided on the n-type region in one sub-cell from among two adjacent sub-cells, a p-side part 20p provided on the p-type region in the other sub-cell, and a connection part 20c between the n-side part 20n and the p-side part 20p. The connection part 20c is extended in a direction intersecting with the first direction and the second direction in the isolation region 50Wx.

Embodiments of the present invention have been described above. However, the present invention is not limited to the embodiments, and includes a structure in which components of each embodiments are appropriately combined and replaced.

First Modification

Figure 42:
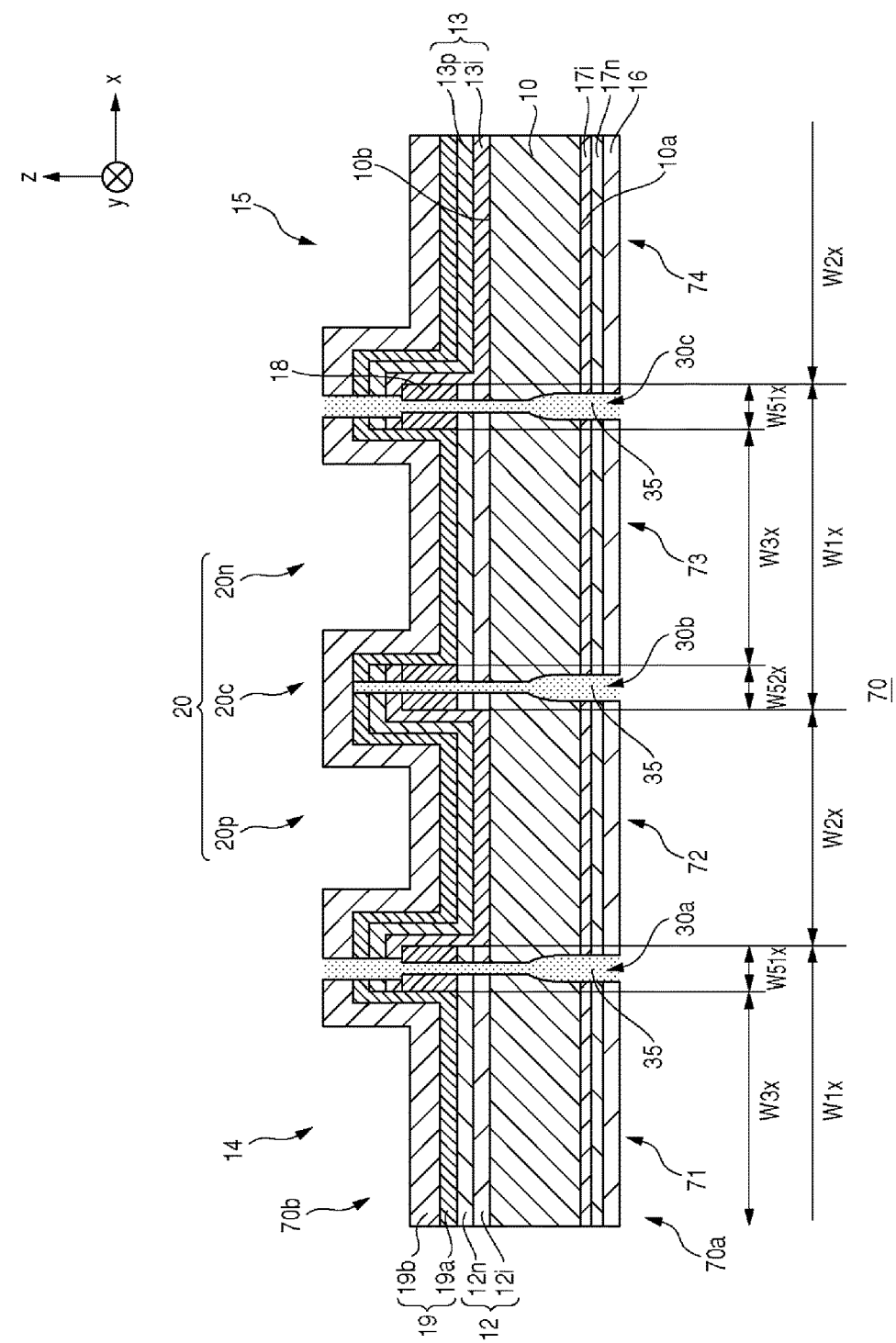
FIG. 42 is a sectional view of a structure of a solar cell according to a first modification.

FIG. 42 is a sectional view of a structure of a solar cell 70 according to a first modification. The first modification is different from the above embodiments in a point that a filling part 35 is provided in each of boundaries 30a to 30c for dividing adjacent sub-cells.

The filling part 35 has a function to bond the adjacent sub-cells to each other. It is preferable that the filling part 35 be configured of an insulating material so as to insulate the adjacent sub-cells. Also, it is preferable that the material be a transparent material so as not to shield light entering from a light receiving surface 70a to a semiconductor substrate 10. For example, the filling part 35 is a resin material such as ethylene-vinyl acetate copolymer (EVA), polyvinyl butyral (PVB), and polyimide.

By providing the filling part 35, the strength of each of the boundaries 30a to 30c for dividing the sub-cells can be increased, and the strength of the whole solar cell 70 can be increased. According to this, reliability of the solar cell 70 can be improved.

In the solar cell 70 of one aspect, a groove 35 may be filled with the resin material.

Second Modification

Figure 43:
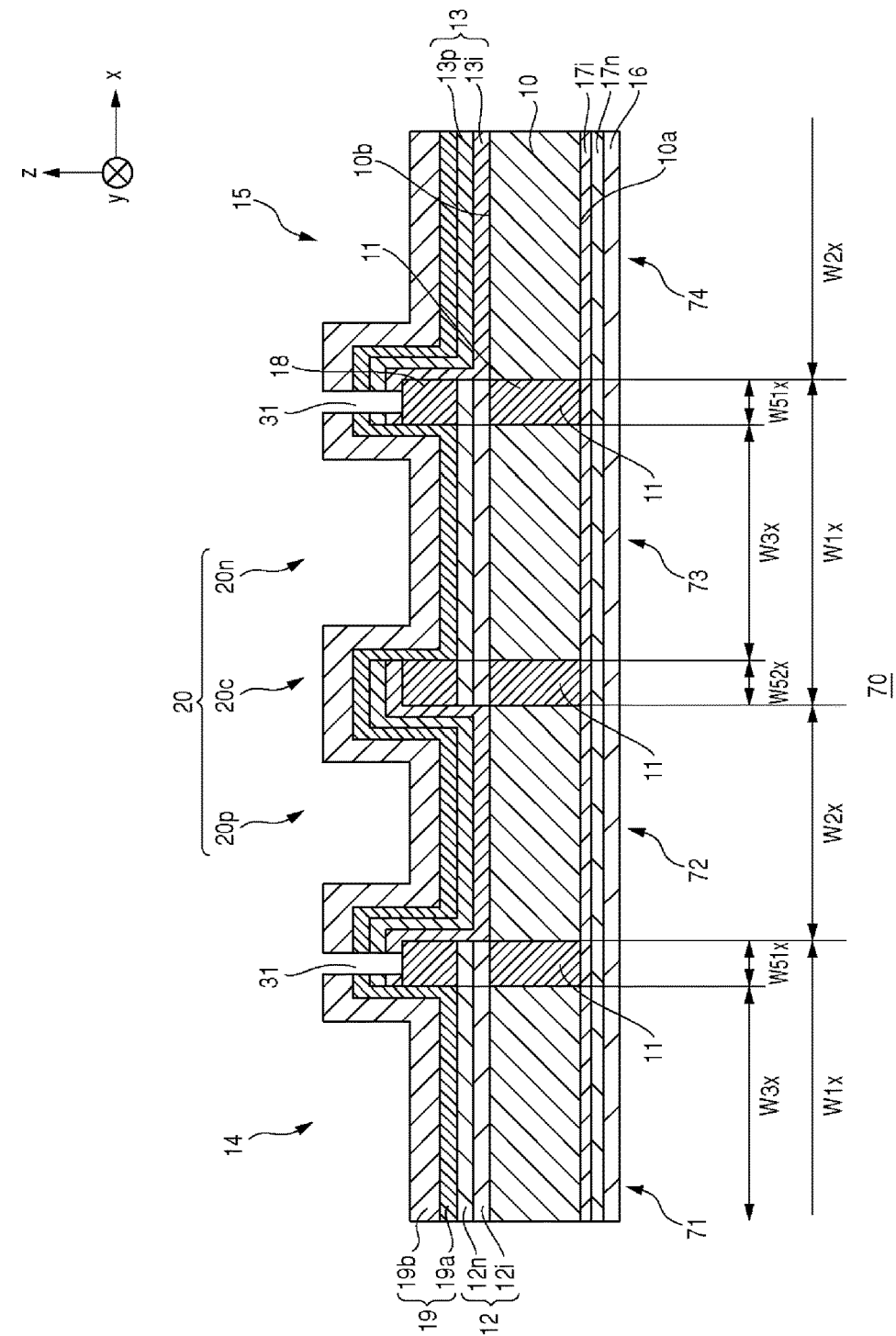
FIG. 43 is a sectional view of a structure of a solar cell according to a second modification.

FIG. 43 is a sectional view of a structure of a solar cell 70 according to a second modification. The second modification is different from the above embodiments in a point that insulators 11 are provided in isolation regions W51x and W52x instead of the insulation grooves.

A semiconductor substrate 10 according to the second modification includes the insulators 11. The insulators 11 are provided at positions corresponding to the isolation regions W51x and W52x so as to pass through the semiconductor substrate 10. The insulator 11 is configured of an inorganic material having lower conductivity than the semiconductor substrate 10. For example, the insulator 11 is silicon oxide, silicon oxide nitride, and silicon nitride. By providing the insulator 11 so as to pass through the semiconductor substrate 10, the movement of carries between the adjacent sub-cells via the semiconductor substrate 10 can be prevented without cutting the semiconductor substrate 10.

In order to manufacture the solar cell 70 according to the second modification, it is preferable that a substrate in which the insulator 11 is provided in a partial region of the single crystal silicon substrate is used as the semiconductor substrate 10 instead of an n-type single crystal silicon substrate. For example, an n-type single crystal silicon ingot before being cut as the semiconductor substrate 10 is prepared. The ingot is cut in a direction perpendicular to a surface to be cut as the substrate, and a silicon nitride (SiN) layer to be the insulator 11 is stuck on the cross section. The semiconductor substrate 10 having the insulator 11 can be manufactured by cutting the ingot in which the insulator 11 is sandwiched as the substrate.

In the second modification, since an insulation groove which passes through the semiconductor substrate 10 is not provided, the strength of the whole solar cell 70 can be increased. According to this, reliability of the solar cell 70 can be improved.

In the solar cell 70 of one aspect, an insulation part may have a member with a lower conductivity than the semiconductor substrate.

Third Modification

Figure 44:
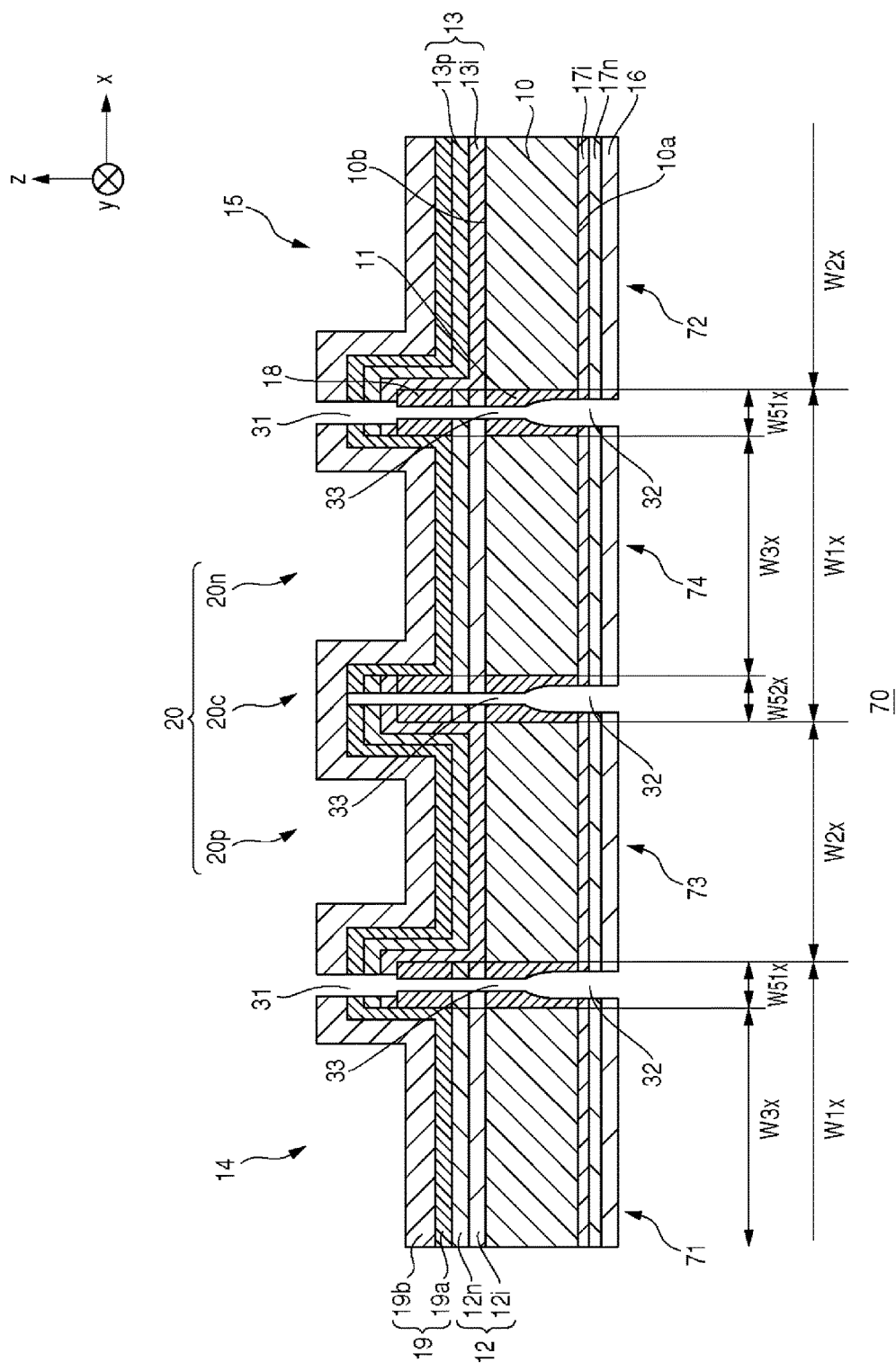
FIG. 44 is a sectional view of a structure of a solar cell according to a third modification.

FIG. 44 is a sectional view of a structure of a solar cell 70 according to a third modification. In the third modification, insulators 11 are provided in isolation regions W51x and W52x, and an insulation groove 33 is formed to cleave the insulator 11. According to this, insulation between the sub-cells can be enhanced.

As another modification of the third modification, instead of providing the insulator 11, an oxidation treatment may be performed to a surface of the insulation groove 33 in the solar cell 70 according to the above embodiments. The insulation between the sub-cells can be enhanced by forming an oxidation part in which a silicon layer is oxidized on the surface of the insulation groove 33. A nitriding treatment may be performed instead of the oxidation treatment, and other surface treatment may be performed so as to cover the surface of the insulation groove 33 with a member having a lower conductivity than the single crystal silicon substrate.

In the solar cell 70 of one aspect, an oxidation part may be provided in a groove 33.

Fourth Modification

Figure 45:
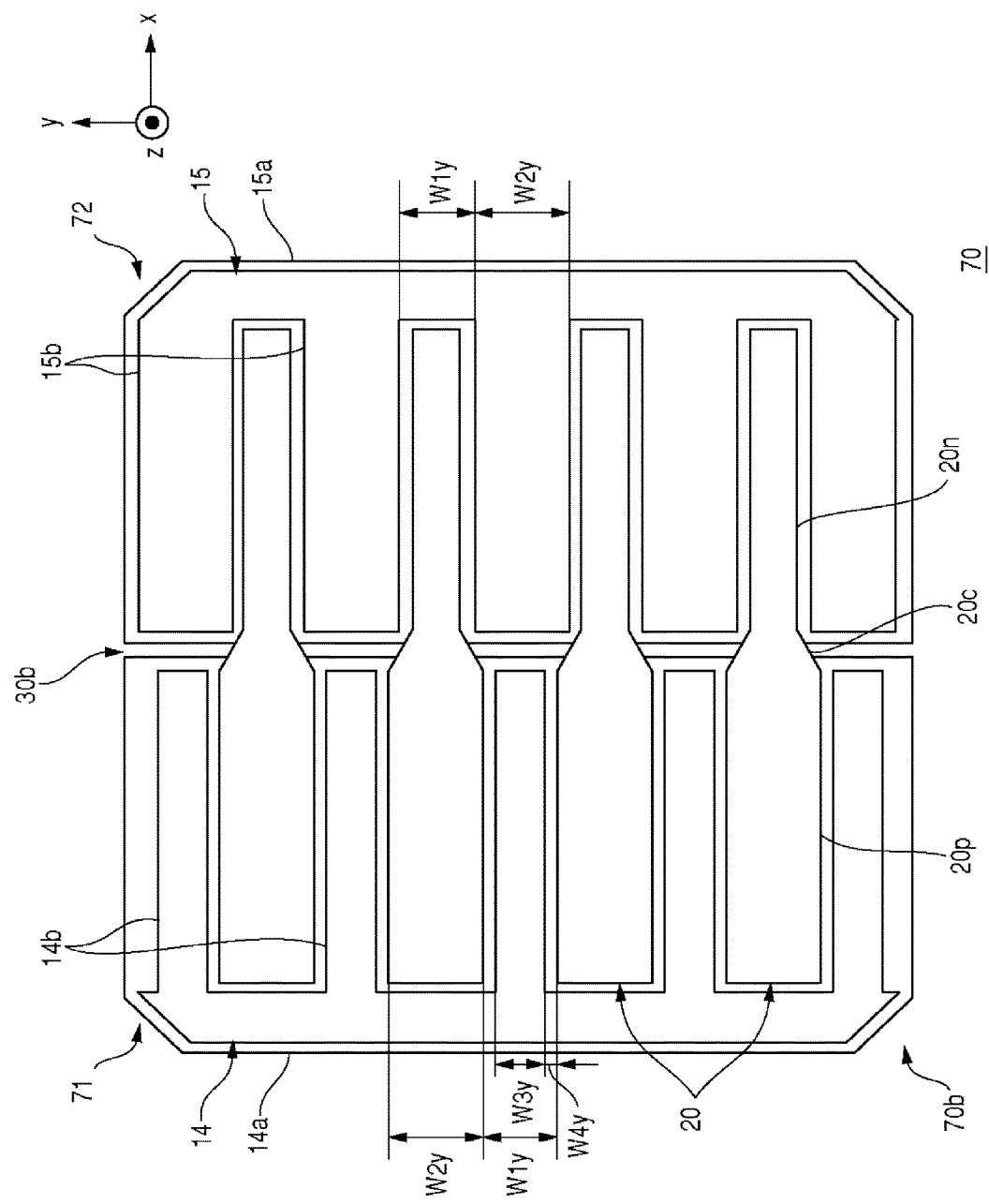
FIG. 45 is a sectional view of a structure of a solar cell according to a fourth modification.

FIG. 45 is a plan view of a solar cell 70 according to a fourth modification. In the above embodiments, the solar cell 70 has been divided into four sub-cells 71 to 74. However, the solar cell 70 is divided into two sub-cells 71 and 72 in the fourth modification.

An n-side electrode 14 is provided in the first sub-cell 71, and a p-side electrode 15 is provided in the second sub-cell 72. A boundary 30 for dividing the first sub-cell 71 and the second sub-cell 72 is formed between the first sub-cell 71 and the second sub-cell 72. A sub-electrode 20 which connects the first sub-cell 71 to the second sub-cell 72 is formed over the boundary 30.

The number of sub-cells included in the solar cell 70 is not limited to this. The solar cell 70 may be divided into three sub-cells or five or more sub-cells. A case corresponding to the second embodiment is illustrated in FIG. 45. However, as the solar cell 70 according to the third embodiment, the number of sub-cells of the solar cell 70 in which the sub-electrodes are arranged in an oblique direction may be two, and the solar cell 70 may be divided into three sub-cells or five or more sub-cells.

Fifth Modification

Figure 46:
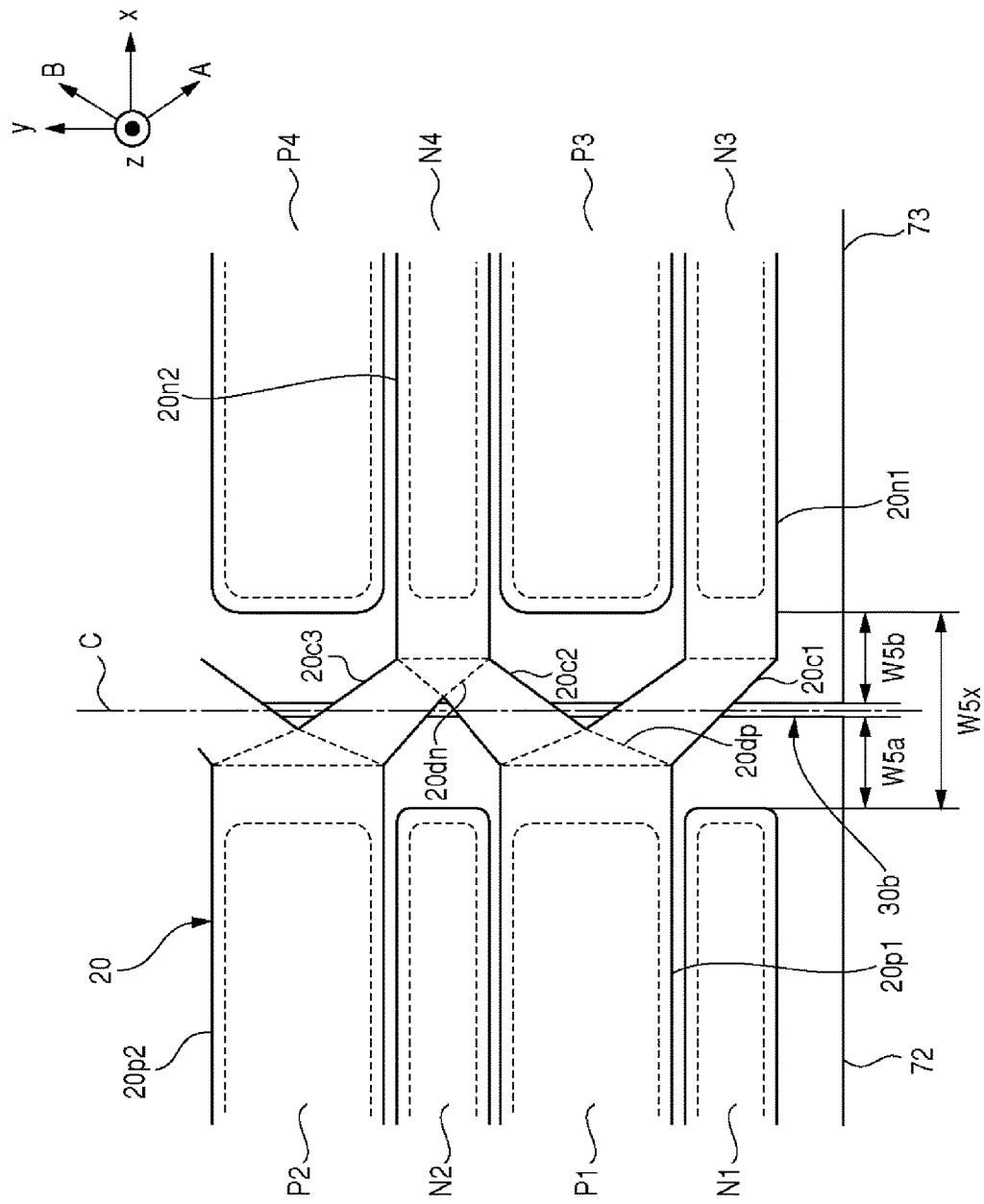
FIG. 46 is a sectional view of a structure of a solar cell according to a fifth modification.

FIG. 46 is a plan view of a solar cell 70 according to a fifth modification. In the fifth modification, the solar cell 70 has the same structure as the third embodiment. However, the fifth embodiment is different from the third embodiment in a point that a p-side branch part 20*dp* and an n-side branch part 20*dn* are arranged at positions closer to a center line C of an isolation region W5*x*. By arranging the p-side branch part 20*dp* and the n-side branch part 20*dn* at the positions close to the center line C, angles between the x direction in which a plurality of sub-cells is arrange and directions A and B in which connection parts 20*c*1 to 20*c*3 are extended can be increased. According to this, an effect of tension relaxation caused by a branch structure included in a sub-electrode 20 can be further improved.

It should be understood that the invention is not limited to the above-described embodiment, but may be modified into various forms on the basis of the spirit of the invention. Additionally, the modifications are included in the scope of the invention.

What is claimed is:

1. A solar cell comprising:
a photoelectric converter that includes a light receiving surface and a back surface opposed to the light receiving surface and includes n-type regions and p-type regions which are alternately arranged in a first direction on the back surface; and
an electrode layer that is provided only on the back surface, wherein
the photoelectric converter includes a plurality of sub-cells arranged in a second direction intersecting with the first direction and an isolation region provided between adjacent sub-cells,
the electrode layer includes an n-side electrode which is provided on the n-type regions in a first sub-cell at an end of the plurality of sub-cells and disposed within the first sub-cell, a p-side electrode which is provided on the p-type regions in a second sub-cell at the other end of the plurality of sub-cells and disposed within the second sub-cell, and a plurality of sub-electrodes which are provided over two adjacent sub-cells,
each sub-electrode of the plurality of sub-electrodes comprises:
a plurality of n-side parts which are provided on the n-type regions in one sub-cell of the two adjacent sub-cells;
a plurality of p-side parts which are provided on the p-type regions in the other sub-cell of the two adjacent sub-cells; and
a plurality of connection parts, each connecting one of the plurality of n-side parts and one of the plurality of p-type parts, and
in plan view, the plurality of connection parts are arranged along the first direction and spaced apart from each other over the isolation region, wherein
the photoelectric converter further includes:
a first conductivity type layer on the back surface, which forms the n-type regions;
a second conductivity type layer on the back surface, which forms the p-type regions; and
a third conductivity type layer on the light receiving surface, the third conductivity type layer having a first surface facing the light receiving surface of the substrate, and a second surface opposite to the first surface, and
the isolation region extends from the second surface of the third conductivity type layer to the back surface of the substrate through the third conductivity type layer and the substrate.

2. The solar cell according to claim 1, wherein
the photoelectric converter includes a semiconductor substrate, a first conductivity type layer which is provided on a back surface of the semiconductor substrate and forms the n-type regions, and a second conductivity type layer which is provided on the back surface of the semiconductor substrate and forms the p-type regions, and
an insulation part which passes through at least the semiconductor substrate is provided in the isolation region.

3. The solar cell according to claim 2, wherein
the insulation part includes a groove which passes through at least the semiconductor substrate.

4. The solar cell according to claim 3, wherein
an oxide portion is provided on a surface of the groove.

5. The solar cell according to claim 3, wherein
the groove is filled with a resin material.

6. The solar cell according to claim 2, wherein
the insulation part has a member with a lower conductivity than the semiconductor substrate.

7. The solar cell according to claim 1, wherein
each of the n-side electrode includes an n-side bus bar electrode extending in the first direction, and connecting two or more the n-type regions in the first sub-cell electrically, and
the p-side electrode includes a p-side bus bar electrode extending in the first direction, and connecting two or more the p-type regions in the second sub-cell electrically.

8. A solar cell module comprising:
a plurality of solar cells, each of the plurality of solar cells being the solar cell according to claim 1; and
a wiring material that connects the plurality of solar cells to each other, wherein
the wiring material connects the n-side electrode of one solar cell of adjacent solar cells to the p-side electrode of the other solar cell.

9. The solar cell according to claim 1, wherein
the plurality of connection parts extend in a direction intersecting with the first and second directions in the isolation region, in plan view.

10. A solar cell comprising:
a photoelectric converter that includes a light receiving surface and a back surface opposed to the light receiving surface and includes n-type regions and p-type regions which are alternately arranged in a first direction on the back surface; and
an electrode layer that is provided only on the back surface, wherein
the photoelectric converter includes a plurality of sub-cells arranged in a second direction intersecting with the first direction and an isolation region provided between adjacent sub-cells,
the electrode layer includes an n-side electrode which is provided on the n-type regions in a first sub-cell at an end of the plurality of sub-cells and disposed within the first sub-cell, a p-side electrode which is provided on the p-type regions in a second sub-cell at the other end of the plurality of sub-cells and disposed within the second sub-cell, and a plurality of sub-electrodes which are provided over two adjacent sub-cells, each sub-electrode of the plurality of sub-electrodes comprises:
- a plurality of n-side parts which are provided on the n-type regions in one sub-cell of the two adjacent sub-cells;
- a plurality of p-side parts which are provided on the p-type regions in the other sub-cell of the two adjacent sub-cells; and
- a plurality of connection parts, each connecting one of the plurality of n-side parts and one of the plurality of p-type parts, and in plan view, the plurality of connection parts are arranged along the first direction and spaced apart from each other over the isolation region, wherein two connecting parts of the plurality of connecting parts are connected to one n-side part of the plurality of n-side parts within the one sub-cell of the two adjacent sub-cells and two p-side parts of the plurality of p-type parts within the other sub-cell of the two adjacent sub-cells.

11. A solar cell comprising:

a photoelectric converter that includes a light receiving surface and a back surface opposed to the light receiving surface and includes n-type regions and p-type regions which are alternately arranged in a first direction on the back surface; and an electrode layer that is provided only on the back surface, wherein the photoelectric converter includes a plurality of sub-cells arranged in a second direction intersecting with the first direction and an isolation region provided between adjacent sub-cells, the electrode layer includes an n-side electrode which is provided on the n-type regions in a first sub-cell at an end of the plurality of sub-cells and disposed within the first sub-cell, a p-side electrode which is provided on the p-type regions in a second sub-cell at the other end of the plurality of sub-cells and disposed within the second sub-cell, and a plurality of sub-electrodes which are provided over two adjacent sub-cells, each sub-electrode of the plurality of sub-electrodes comprises:
- a plurality of n-side parts which are provided on the n-type regions in one sub-cell of the two adjacent sub-cells;
- a plurality of p-side parts which are provided on the p-type regions in the other sub-cell of the two adjacent sub-cells; and
- a plurality of connection parts, each connecting one of the plurality of n-side parts and one of the plurality of p-type parts, and in plan view, the plurality of connection parts are arranged along the first direction and spaced apart from each other over the isolation region, wherein two connecting parts of the plurality of connecting parts are connected to one p-side part of the plurality of p-side parts within the other sub-cell of the two adjacent sub-cells and two n-side parts of the plurality of n-type parts within the one sub-cell of the two adjacent sub-cells.

12. The solar cell according to claim 10, wherein the photoelectric converter includes a semiconductor substrate, a first conductivity type layer which is provided on a back surface of the semiconductor substrate and forms the n-type regions, and a second conductivity type layer which is provided on the back surface of the semiconductor substrate and forms the p-type regions, and an insulation part which passes through at least the semiconductor substrate is provided in the isolation region.

13. The solar cell according to claim 12, wherein
the insulation part includes a groove which passes through at least the semiconductor substrate.

14. The solar cell according to claim 12, wherein
the insulation part has a member with a lower conductivity than the semiconductor substrate.

15. The solar cell according to claim 10, wherein
each of the n-side electrode includes an n-side bus bar electrode extending in the first direction, and connecting two or more the n-type regions in the first sub-cell electrically, and
the p-side electrode includes a p-side bus bar electrode extending in the first direction, and connecting two or more the p-type regions in the second sub-cell electrically.

16. The solar cell according to claim 11, wherein
the photoelectric converter includes a semiconductor substrate, a first conductivity type layer which is provided on a back surface of the semiconductor substrate and forms the n-type regions, and a second conductivity type layer which is provided on the back surface of the semiconductor substrate and forms the p-type regions, and an insulation part which passes through at least the semiconductor substrate is provided in the isolation region.

17. The solar cell according to claim 16, wherein
the insulation part includes a groove which passes through at least the semiconductor substrate.

18. The solar cell according to claim 16, wherein
the insulation part has a member with a lower conductivity than the semiconductor substrate.

19. The solar cell according to claim 11, wherein
each of the n-side electrode includes an n-side bus bar electrode extending in the first direction, and connecting two or more the n-type regions in the first sub-cell electrically, and
the p-side electrode includes a p-side bus bar electrode extending in the first direction, and connecting two or more the p-type regions in the second sub-cell electrically.

* * * * *